US011303830B2

(12) United States Patent
Kumagai

(10) Patent No.: US 11,303,830 B2
(45) Date of Patent: Apr. 12, 2022

(54) PHOTOELECTRIC CONVERSION DEVICE AND IMAGING SYSTEM

(71) Applicant: CANON KABUSHIKI KAISHA, Tokyo (JP)

(72) Inventor: Tomoya Kumagai, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 11 days.

(21) Appl. No.: 17/061,748

(22) Filed: Oct. 2, 2020

(65) Prior Publication Data

US 2021/0112211 A1  Apr. 15, 2021

(30) Foreign Application Priority Data

Oct. 11, 2019 (JP) .............................. JP2019-187903

(51) Int. Cl.
| | |
|---|---|
| *H04N 5/355* | (2011.01) |
| *H04N 5/374* | (2011.01) |
| *H04N 5/378* | (2011.01) |
| *H04N 5/357* | (2011.01) |
| *G01C 3/08* | (2006.01) |
| *H03M 1/56* | (2006.01) |

(Continued)

(52) U.S. Cl.
CPC .............. *H04N 5/355* (2013.01); *G01C 3/085* (2013.01); *H04N 5/3745* (2013.01); *H04N 5/378* (2013.01)

(58) Field of Classification Search
CPC ...... H04N 5/355; H04N 5/3745; H04N 5/357; H04N 5/378; G01C 3/085; H03M 1/56; H03M 1/123

USPC .... 348/297, 294, 308, 300, 301, 302, 229.1; 257/291, 292, 293, 443, 314, 391; 250/208.1; 341/169, 170
See application file for complete search history.

(56) References Cited

U.S. PATENT DOCUMENTS

| 8,520,110 B2 * | 8/2013 | Kitami ..................... H04N 3/14 348/241 |
| 8,576,317 B2 * | 11/2013 | Sakakibara .............. H04N 3/14 348/308 |

(Continued)

FOREIGN PATENT DOCUMENTS

| JP | 2014-96670 A | 5/2014 |
| JP | 2016-92662 A | 5/2016 |
| JP | 2018-6880 A | 1/2018 |

*Primary Examiner* — Marly S Camargo
(74) *Attorney, Agent, or Firm* — Venable LLP

(57) ABSTRACT

A photoelectric conversion device includes pixels arranged to form columns, comparator circuits for respective columns, and a control circuit that controls the comparator circuits. Each comparator circuit includes a first comparator circuit connected to a first pixel of a first color, a second comparator circuit arranged on a column adjacent to the first comparator circuit and connected to a second pixel of a second color, and a third comparator circuit arranged on a column adjacent to the second comparator circuit and connected to a third pixel of the first color. Each comparator circuit compares a pixel signal on a corresponding column with a reference signal changing with time and outputs a comparison signal indicating a different level whether a difference between these signals is smaller or larger than a threshold. The control circuit controls the threshold to change stepwise in order of the first, third, and second comparator circuits.

19 Claims, 11 Drawing Sheets

(51) Int. Cl.
*H03M 1/12* (2006.01)
*H04N 5/3745* (2011.01)

(56) References Cited

U.S. PATENT DOCUMENTS

| | | | | |
|---|---|---|---|---|
| 8,878,954 | B2* | 11/2014 | Hashimoto | H04N 5/335 |
| | | | | 348/222.1 |
| 9,019,138 | B2* | 4/2015 | Iwaki | H04N 5/378 |
| | | | | 341/156 |
| 9,979,916 | B2 | 5/2018 | Hiyama et al. | H04N 5/3745 |
| 10,567,686 | B2* | 2/2020 | Tanaka | H04N 5/365 |
| 10,742,905 | B2 | 8/2020 | Iwata et al. | H04N 5/3696 |
| 2008/0192127 | A1* | 8/2008 | Sakai | H04N 5/335 |
| | | | | 348/222.1 |
| 2011/0141324 | A1* | 6/2011 | Koseki | H04N 5/3658 |
| | | | | 348/241 |
| 2013/0075588 | A1* | 3/2013 | Kawaguchi | H01L 27/146 |
| | | | | 250/208.1 |
| 2014/0124651 | A1 | 5/2014 | Nakahara | |
| 2019/0379850 | A1 | 12/2019 | Shinohara et al. | H04N 5/3765 |
| 2021/0314516 | A1* | 10/2021 | Yonemoto | H04N 5/37457 |
| 2021/0352225 | A1* | 11/2021 | Nishihara | H04N 5/32 |

* cited by examiner

PHOTOELECTRIC CONVERSION DEVICE AND IMAGING SYSTEM

BACKGROUND OF THE INVENTION

Field of the Invention

The present invention relates to a photoelectric conversion device and an imaging system.

Description of the Related Art

Some photoelectric conversion devices such as a CMOS image sensor perform analog-to-digital (AD) conversion on a pixel signal and output the converted signal. In such photoelectric conversion devices, each of plurality of comparator circuits provided on a pixel column basis compares a pixel signal with a reference signal and outputs a comparison signal. By inputting a digital value of a counter to a memory device at a timing when a comparison signal is output, it is possible to perform AD conversion on a pixel signal. Such a comparator circuit has a reset function of clamping an offset component inside the circuit and cancelling the offset. Accordingly, accuracy in comparison in the comparator circuit may be increased.

Japanese Patent Application Laid-Open No. 2014-096670 discloses that an instruction signal for reset of a comparator circuit is divided into a plurality of reset signals of different timings to clamp a plurality of offset levels in accordance with the plurality of reset signals. Japanese Patent Application Laid-Open No. 2018-006880 discloses a technique in which a shield line is provided between signal lines to reduce kickback noise of a plurality of reset signals and reduce noise.

In Japanese Patent Application Laid-Open No. 2014-096670 and Japanese Patent Application Laid-Open No. 2018-006880, however, the timing to provide reset instructions using a plurality of reset signals is not fully considered. According to an intensive study made by the inventor regarding reset operations of comparator circuits, it was found for the first time that, for some timings of reset instructions, variation of one reset signal propagates to another reset signal and AD-converted data changes from a value which would otherwise be obtained.

SUMMARY OF THE INVENTION

The present invention intends to provide a photoelectric conversion device and an imaging system including comparator circuits having high comparison accuracy.

According to one aspect of the present invention, provided is a photoelectric conversion device including a plurality of pixels arranged to form a plurality of columns, a plurality of comparator circuits provided in association with the plurality of columns, and a control circuit that controls the plurality of comparator circuits. The plurality of comparator circuits includes a first comparator circuit connected to a first pixel having sensitivity to a first color, a second comparator circuit arranged on a column adjacent to a column of the first comparator circuit and connected to a second pixel having sensitivity to a second color that is different from the first color, and a third comparator circuit arranged on a column adjacent to a column of the second comparator circuit and connected to a third pixel having sensitivity to the first color. Each of the plurality of comparator circuits compares a pixel signal output from a pixel on a corresponding column with a reference signal whose level changes as time elapses and outputs a comparison signal indicating different levels in accordance with whether a difference between the pixel signal and the reference signal is smaller than or larger than the threshold value, and the control circuit controls the threshold value of each of the plurality of comparator circuits so as to change the threshold value stepwise in order of the first comparator circuit, the third comparator circuit, and the second comparator circuit.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
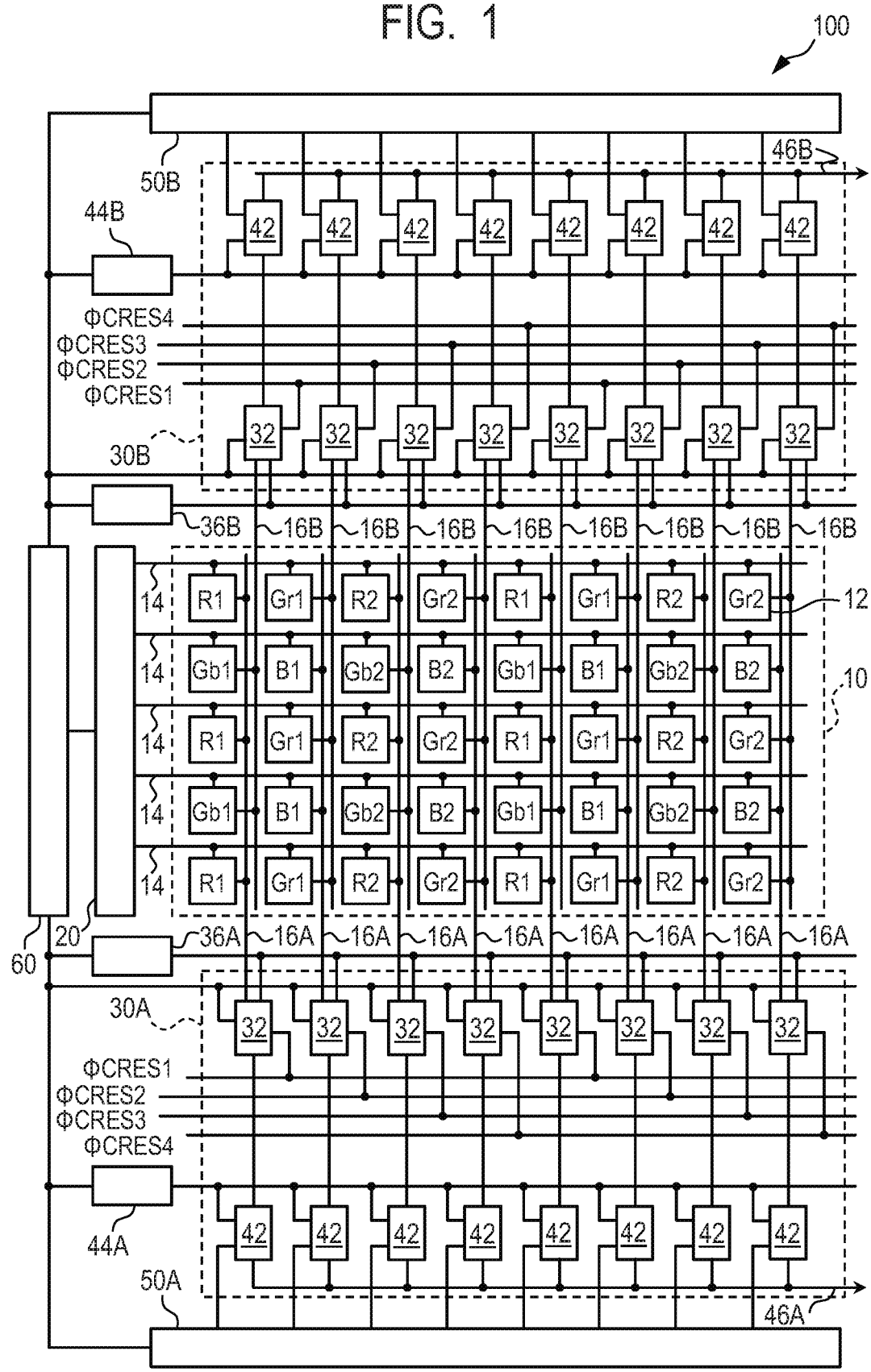
FIG. 1 is a block diagram illustrating a general configuration of a photoelectric conversion device according to a first embodiment of the present invention.

A general configuration of a photoelectric conversion device according to a first embodiment of the present invention will be described with reference to FIG. 1. FIG. 1 is a block diagram illustrating a general configuration of a photoelectric conversion device according to the present embodiment.

As illustrated in FIG. 1, a photoelectric conversion device 100 according to the present embodiment includes a pixel region 10, a vertical scanning circuit 20, AD conversion circuit units 30A and 30B, horizontal scanning circuits 50A and 50B, and a timing generation circuit 60. Further, the photoelectric conversion device 100 according to the present embodiment further includes reference signal generation circuits 36A and 36B and counters 44A and 44B. The AD conversion circuit unit 30A, the reference signal generation circuit 36A, the counter 44A, and the horizontal scanning circuit 50A form a set of readout circuit unit. The AD conversion circuit unit 30B, the reference signal generation circuit 36B, the counter 44B, and the horizontal scanning circuit 50B form another set of readout circuit unit. The pixel region 10 is arranged between these two readout circuit units.

In the pixel region 10, a plurality of pixels 12 arranged in a matrix over a plurality of rows and plurality of columns are provided. Each of the pixels 12 includes a photoelectric converter formed of a photoelectric conversion element such as a photodiode and outputs a pixel signal in accordance with a light amount of incident light. The number of rows and the number of columns of the pixel array arranged in the pixel region 10 are not particularly limited. Further, in the pixel region 10, an optical black pixel whose photoelectric converter is shielded from light, a dummy pixel that does not output any signal, or the like may be arranged in addition to effective pixels that output pixel signals in accordance with the light amount of incident light.

Each pixel 12 arranged in the pixel region 10 has a color filter having a predetermined spectral sensitivity characteristic. FIG. 1 illustrates an example in which a plurality of pixels 12 are arranged in accordance with the Bayer arrangement that is one of the arrangements of color patterns of color filters. In the Bayer arrangement, pixels (G pixels) 12 having a green color filter, pixels (R pixels) 12 having a red color filter, and pixels (B pixels) 12 having a blue color filter are arranged at a ratio of 2:1:1. Herein, the R pixel is a pixel having sensitivity to light of a red wavelength range, the G pixel is a pixel having sensitivity to light of a green wavelength range, and the B pixel is a pixel having sensitivity to light of a blue wavelength range. In general, the spectral sensitivity of these color pixels is higher for the G pixel, the R pixel, and the B pixel in this order.

In the Bayer arrangement, a row on which the R pixel and the G pixel are arranged alternately and a row on which the G pixel and the B pixel are arranged alternately are arranged alternately. For the purpose of illustration here, the G pixel arranged on the same row as the R pixel is denoted as a Gr pixel, and the G pixel arranged on the same row as the B pixel is denoted as a Gb pixel. Further, in the present embodiment, because consecutive four pixels on the same row are handled as one unit, respective pixels 12 are distinguished by using references in which the number 1 or 2 is added to Gr, Gb, R, and B that are symbols representing colors. That is, as illustrated in FIG. 1, the pixel region 10 has rows on which an R1 pixel, a Gr1 pixel, an R2 pixel, a Gr2 pixel, . . . are arranged and rows on which a Gb1 pixel, a B1 pixel, a Gb2 pixel, a B2 pixel, . . . are arranged.

On each row of the pixel array of the pixel region 10, a control line 14 is arranged extending in a first direction (horizontal direction in FIG. 1). Each of control lines 14 is connected to the pixels 12 arranged in the first direction, respectively, to form a signal line common to these pixels 12. The first direction in which the control line 14 extends may be referred to as a row direction or the horizontal direction. The control lines 14 are connected to the vertical scanning circuit 20.

On each column of the pixel array of the pixel region 10, an output line 16A and an output line 16B are arranged extending in a second direction (vertical direction in FIG. 1) intersecting the first direction. The plurality of pixels 12 forming the pixel region 10 are divided into the pixels 12 connected to the output lines 16A and the pixels 12 connected to the output lines 16B. In the configuration example illustrated in FIG. 1, the pixels 12 connected to the output line 16A and the pixels 12 connected to the output line 16B are arranged alternately on each row and each column of the pixel array forming the pixel region 10.

Specifically, each of the output lines 16A is connected to the R pixel or the Gb pixel of the pixels 12 arranged in the second direction and forms a signal line common to these pixels 12. Each of the output lines 16B is connected to the Gr pixel or the B pixel of the pixels 12 arranged in the second direction and forms a signal line common to these pixels 12. The second direction in which the output lines 16A and 16B extend may be referred to as a column direction or the vertical direction. The output lines 16A are connected to the AD conversion circuit unit 30A. Further the output lines 16B are connected to the AD conversion circuit unit 30B.

The vertical scanning circuit 20 is a control circuit unit that supplies, to the pixels 12 via the control lines 14 provided on respective rows in the pixel array, control signals used for driving readout circuits in the pixels 12 when reading out signals from the pixels 12. The vertical scanning circuit 20 may be formed using a shift register or an address decoder. The vertical scanning circuit 20 drives the pixels 12 of the pixel region 10 on a row basis by control signals supplied via the control lines 14. The pixel signals on respective columns read out from the pixels 12 on a row basis are input to the AD conversion circuit unit 30A via the output lines 16A or input to the AD conversion circuit unit 30B via the output lines 16B.

Each of the reference signal generation circuits 36A and 36B is a circuit that generates a reference signal, for example, a ramp signal used for AD conversion. The ramp signal refers to a signal whose level gradually changes (increases or decreases) from a predetermined value as time elapses.

The AD conversion circuit unit 30A includes a plurality of comparator circuits 32 and a plurality of memories 42 provided in association with respective columns of the pixel array of the pixel region 10. The comparator circuit 32 and the memory 42 arranged on each column form a column AD conversion circuit unit. The input terminal of the comparator circuit 32 on each column is connected to the output line 16A and the reference signal generation circuit 36A on a corresponding column. The reference signal generation circuit 36A supplies a reference signal to the comparator circuit 32 on each column via a reference signal line. The input terminal of the memory 42 on each column is connected to the output terminal of the comparator circuit 32, the counter 44A, and the horizontal scanning circuit 50A on a corresponding column.

The horizontal scanning circuit 50A is a control circuit unit that supplies, to the memories 42 on respective columns sequentially on a column basis, control signals used for outputting pixel signals stored in the memories 42 on respective columns of the AD conversion circuit unit 30A. The control line of the horizontal scanning circuit 50A provided in association with each column of the pixel region 10 is connected to the memory 42 on a corresponding column. In response to receiving the control signal via a control line on a corresponding column of the horizontal scanning circuit 50A, the memory 42 on each column outputs a held pixel signal to an output line 46A.

Similarly, the AD conversion circuit unit 30B includes a plurality of comparator circuits 32 and a plurality of memories 42 provided in association with respective columns of the pixel array of the pixel region 10. The comparator circuit 32 and the memory 42 arranged on each column form a column AD conversion circuit unit. The input terminal of the comparator circuit 32 on each column is connected to the output line 16B and the reference signal generation circuit 36B on a corresponding column. The reference signal generation circuit 36B supplies a reference signal to the comparator circuit 32 on each column via a reference signal line. The input terminal of the memory 42 on each column is connected to the output terminal of the comparator circuit 32, the counter 44B, and the horizontal scanning circuit 50B on a corresponding column.

Further, the horizontal scanning circuit 50B is a control circuit unit that supplies, to the memories 42 on respective columns sequentially on a column basis, control signals used for outputting pixel signals stored in the memories 42 on respective columns of the AD conversion circuit unit 30B. The control line of the horizontal scanning circuit 50B provided in association with each column of the pixel region 10 is connected to the memory 42 on a corresponding column. In response to receiving the control signal via a control line on a corresponding column of the horizontal scanning circuit 50B, the memory 42 on each column outputs a held pixel signal to an output line 46B.

The timing generation circuit 60 is a control circuit unit that supplies, to the vertical scanning circuit 20, the comparator circuit 32, the reference signal generation circuits 36A and 36B, the counters 44A and 44B, and the horizontal scanning circuits 50A and 50B, control signals used for controlling the operations thereof and the timings of the operations. At least some of these control signals may be supplied from the outside of the photoelectric conversion device 100.

Note that control signals ΦCRES1, ΦCRES2, ΦCRES3, and ΦCRES4 illustrated in FIG. 1 are reset signals of the comparator circuits 32 that are supplied from the timing generation circuit 60 to the comparator circuits 32. The control signals ΦCRES1, ΦCRES2, ΦCRES3, and ΦCRES4 are supplied to the comparator circuits 32 on predetermined columns via different reset signal lines. The control signals ΦCRES1, ΦCRES2, ΦCRES3, and ΦCRES4 supplied to the AD conversion circuit unit 30A may be different control signals from the control signals ΦCRES1, ΦCRES2, ΦCRES3, and ΦCRES4 supplied to the AD conversion circuit unit 30B.

Next, the outline of the operation of the photoelectric conversion device according to the present embodiment will be described with reference to FIG. 1. Each of the plurality of pixels 12 forming the pixel region 10 includes a photoelectric conversion element such as a photodiode and outputs a pixel signal, which is an analog signal, to the output line 16A or the output line 16B. A pixel signal output by the pixel 12 includes a signal corresponding to a signal amount in accordance with the incident light amount and a signal corresponding to a noise amount (a reference signal, a reset signal). Pixel signals are output from the pixels 12 on a row basis by control signals supplied from the vertical scanning circuit 20 via the control lines 14 under the control of the timing generation circuit 60. A pixel signal output from the pixel 12 via the output line 16A is input to the AD conversion circuit unit 30A. Further, a pixel signal output from the pixel 12 to the output line 16B is input to the AD conversion circuit unit 30B.

With the pixels 12 belonging to two adjacent rows being driven at the same time, pixel signals of R pixels or pixel signals of B pixels are output at the same time to the output line 16A on each column. Further, pixel signals of Gr pixels or pixel signals of Gb pixels are output at the same time to the output line 16B on each column.

A pixel signal input from the pixel 12 to the AD conversion circuit unit 30A via the output line 16A is input to the comparator circuit 32 on a corresponding column. The comparator circuit 32 performs a comparison operation to compare the signal level of a pixel signal with the signal level of a reference signal supplied from the reference signal generation circuit 36A and outputs a latch signal at a timing when a relationship between the signal level of the pixel signal and the signal level of the ramp signal is inverted. A count signal supplied from the counter 44A and an output signal of the comparator circuit 32 are input to the memory 42. The memory 42 stores, as digital data of a pixel signal, a count value indicated by a count signal at a timing when a latch signal is received from the comparator circuit 32.

The horizontal scanning circuit 50A outputs control signals to the memories 42 of the AD conversion circuit unit 30A sequentially on a column basis under the control of the timing generation circuit 60. The memory 42 that has received a control signal from the horizontal scanning circuit 50A outputs digital data AD-converted from a pixel signal to the output line 46A.

Similarly, a pixel signal input from the pixel 12 to the AD conversion circuit unit 30B via the output line 16B is input to the comparator circuit 32 on a corresponding column. The comparator circuit 32 performs a comparison operation to compare the signal level of a pixel signal with the signal level of a reference signal supplied from the reference signal generation circuit 36B and outputs a latch signal at a timing when a relationship between the signal level of the pixel signal and the signal level of the ramp signal is inverted. A count signal supplied from the counter 44B and an output signal of the comparator circuit 32 are input to the memory 42. The memory 42 stores, as digital data of a pixel signal, a count value indicated by a count signal at a timing when a latch signal is received from the comparator circuit 32.

Further, the horizontal scanning circuit 50B outputs control signals to the memories 42 of the AD conversion circuit unit 30B sequentially on a column basis under the control of the timing generation circuit 60. The memory 42 that has received a control signal from the horizontal scanning circuit 50B outputs digital data AD-converted from a pixel signal to the output line 46B.

In such a way, the photoelectric conversion device 100 according to the present embodiment is configured to perform an AD conversion process on pixel signals of R pixels and B pixels by using the AD conversion circuit unit 30A and perform an AD conversion process on pixel signals of Gr pixels and Gb pixels by using the AD conversion circuit unit 30B.

Figure 2:
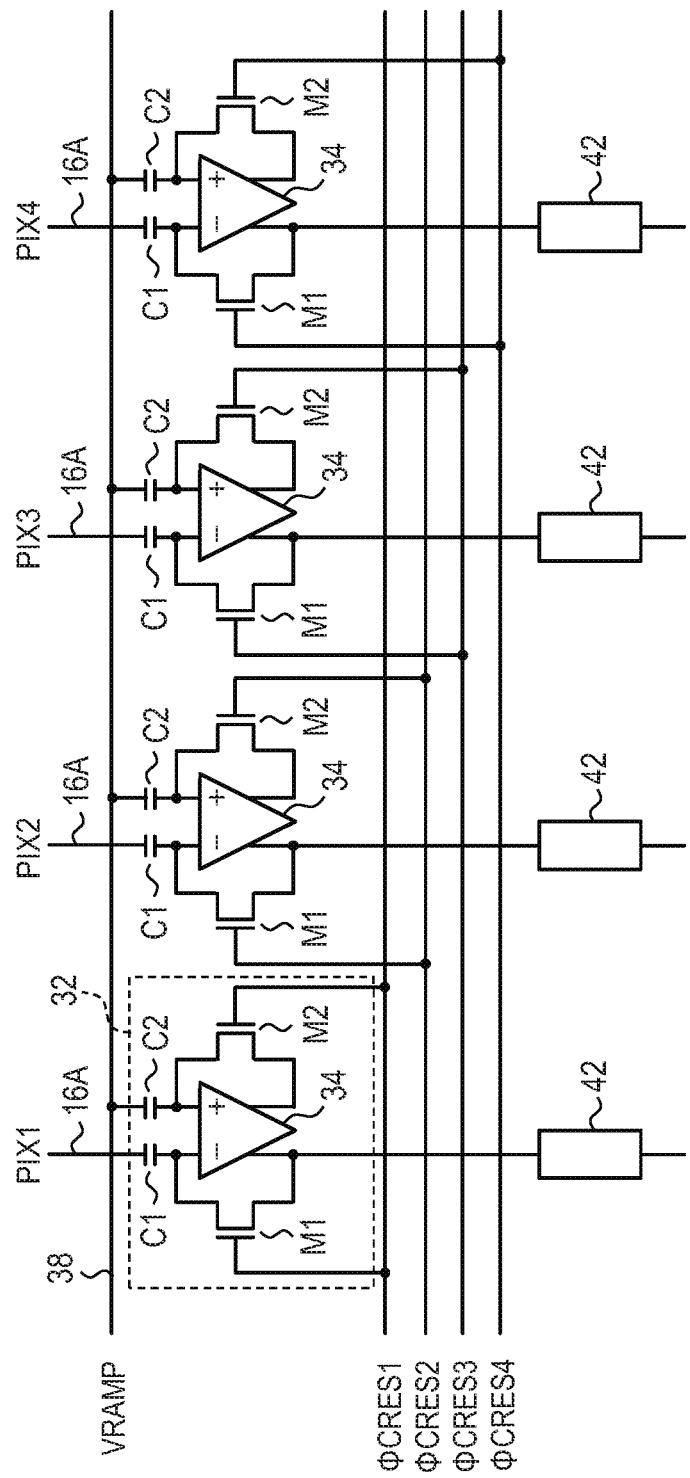
FIG. 2 is a circuit diagram illustrating a configuration example of a comparator circuit in the photoelectric conversion device according to the first embodiment of the present invention.

Next, a configuration example of the comparator circuit 32 in the photoelectric conversion device according to the present embodiment will be described with reference to FIG. 2. FIG. 2 is a circuit diagram illustrating a configuration example of the comparator circuit in the photoelectric conversion device according to the present embodiment. Although illustration is provided here with an example of the comparator circuit 32 forming the AD conversion circuit unit 30A, the same applies to the comparator circuit 32 forming the AD conversion circuit unit 30B. FIG. 2 illustrates four comparator circuits 32 provided in association with consecutive four columns of the plurality of columns forming the pixel array.

Each of the comparator circuits 32 provided in association with each column of the pixel array includes a differential pair circuit 34, input capacitors C1 and C2, and transistors M1 and M2, as illustrated in FIG. 2. The differential pair circuit 34 has a − (negative or inverting) input terminal, a + (positive or non-inverting) input terminal, and two output terminals corresponding thereto (a + output terminal and a − output terminal). The − input terminal of the differential pair circuit 34 is a first input node, for example, and the + input terminal of the differential pair circuit 34 is a second input node, for example. Further, the + output terminal of the differential pair circuit 34 is the first input node, for example, and the − output terminal of the differential pair circuit 34 is the second output node, for example.

The output line 16A is connected to the − input terminal of the differential pair circuit 34 via the input capacitor C1. For example, the reference signal line 38 is connected to the + input terminal of the differential pair circuit 34 via the input capacitor C2. The transistor M1 that controls a connection state (conductive, nonconductive) between the − input terminal and the + output terminal of the differential pair circuit 34 is provided between the − input terminal and the + output terminal of the differential pair circuit 34. The transistor M2 that controls a connection state (conductive, nonconductive) between the + input terminal and the − output terminal of the differential pair circuit 34 is provided between the + input terminal and the − output terminal of the differential pair circuit 34. The + output terminal of the differential pair circuit 34 is connected to the memory 42 on a corresponding column.

A pixel signal PIX is input from the pixel 12 on a corresponding column to the − input terminal of the differential pair circuit 34 via the output line 16A and the input capacitor C1. For the purpose of illustration here, pixel signals PIX1, PIX2, PIX3, and PIX4 are input to the comparator circuits 32 in this order from the left comparator circuit 32 in FIG. 2, respectively. For example, when a pixel signal is read out from the first row in the pixel region 10 of FIG. 1, the pixel signals PIX1 and PIX3 are signals based on the output of R pixels, and the pixel signals PIX2 and PIX4 are signals based on the output of B pixels. A reference signal VRAMP is input from the reference signal generation circuit 36A to the + input terminal of the differential pair circuit 34 via the reference signal line 38 and the input capacitor C2.

The transistors M1 and M2 of each comparator circuit 32 are controlled by a common control signal ΦCRES. Herein, the control signals ΦCRES1, ΦCRES2, ΦCRES3, and ΦCRES4 are supplied to the comparator circuits 32 in this order from the left comparator circuit 32 in FIG. 2, respectively. When the control signal ΦCRES is controlled to a High level and the transistors M1 and M2 are turned on, the threshold voltage of the comparator circuit 32 is reset to a voltage corresponding to a potential difference between the pixel signal PIX and the reference signal VRAMP that are currently being output. More specifically, the threshold voltage of the comparator circuit 32 is reset to a voltage corresponding to a potential difference between the pixel signal PIX and the reference signal VRAMP occurring when the transistors M1 and M2 are switched from an on-state to an off-state. Accordingly, offset levels (threshold voltages) that are different in accordance with the timings of the control signals ΦCRES1, ΦCRES2, ΦCRES3, and ΦCRES4 can be set for the comparator circuits 32 on respective columns. In such a way, the transistors M1 and M2 form reset switches, respectively.

The operation to set the threshold voltage of the comparator circuit 32 in such a way is referred to as reset or auto-zero of the comparator circuit 32. Because the threshold voltages of the comparator circuits 32 are determined by the timings of the control signals ΦCRES1, ΦCRES2, ΦCRES3, and ΦCRES4, it can be said that the control signals ΦCRES1, ΦCRES2, ΦCRES3, and ΦCRES4 reset the threshold voltages of the comparator circuits 32.

Note that the threshold voltage of the comparator circuit 32 refers to a voltage corresponding to a difference between the signal level of a pixel signal and the signal level of a reference signal occurring when the level of a comparison signal output from the comparator circuit 32 changes. That is, the comparator circuit 32 outputs a comparison signal indicating different levels in accordance with whether the difference between the signal level of the pixel signal and the signal level of the reference signal is smaller than or larger than the threshold voltage.

Figure 3:
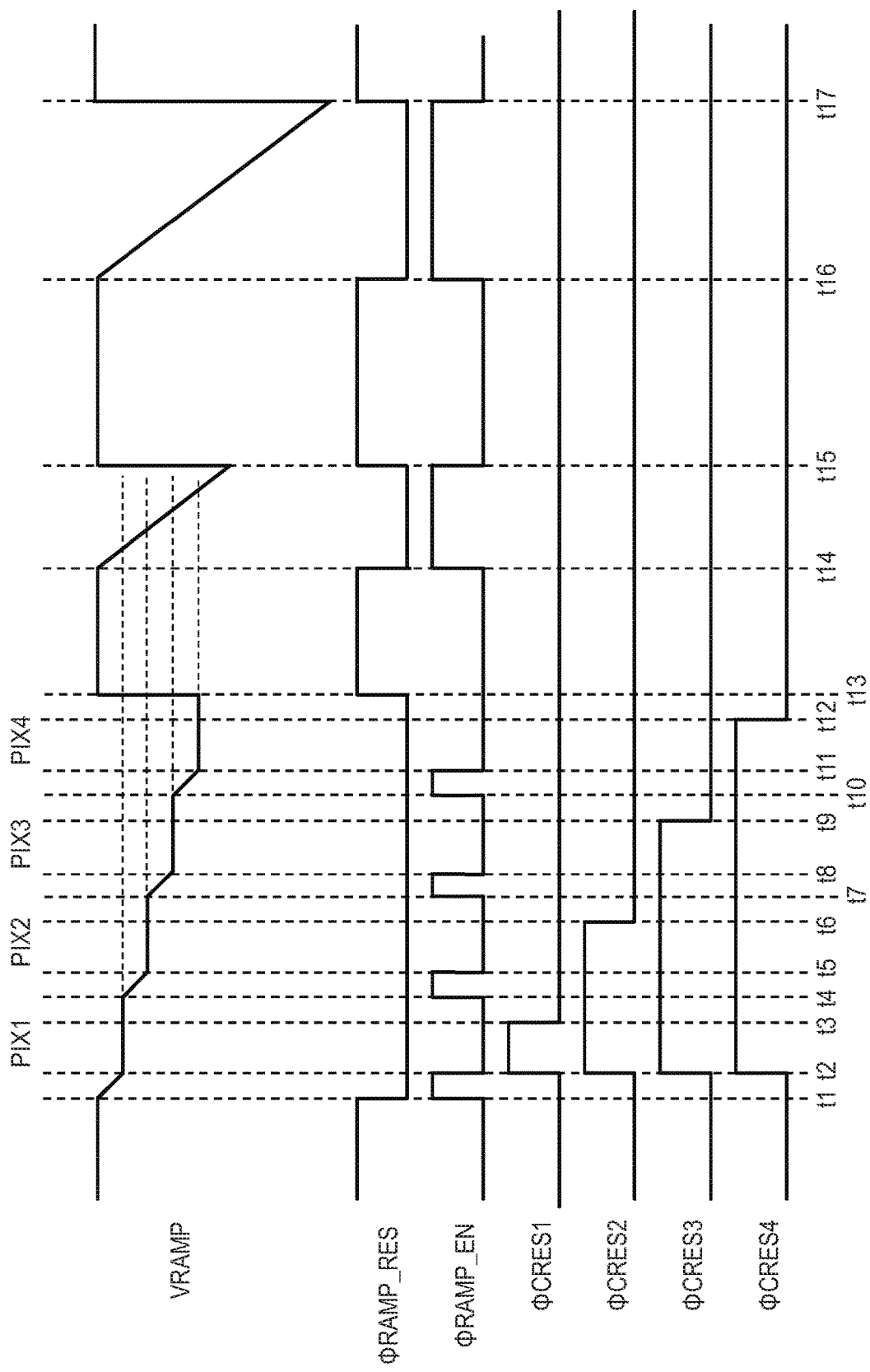
FIG. 3 is a timing diagram illustrating a method of driving a photoelectric conversion device according to a reference example.
Figure 4:
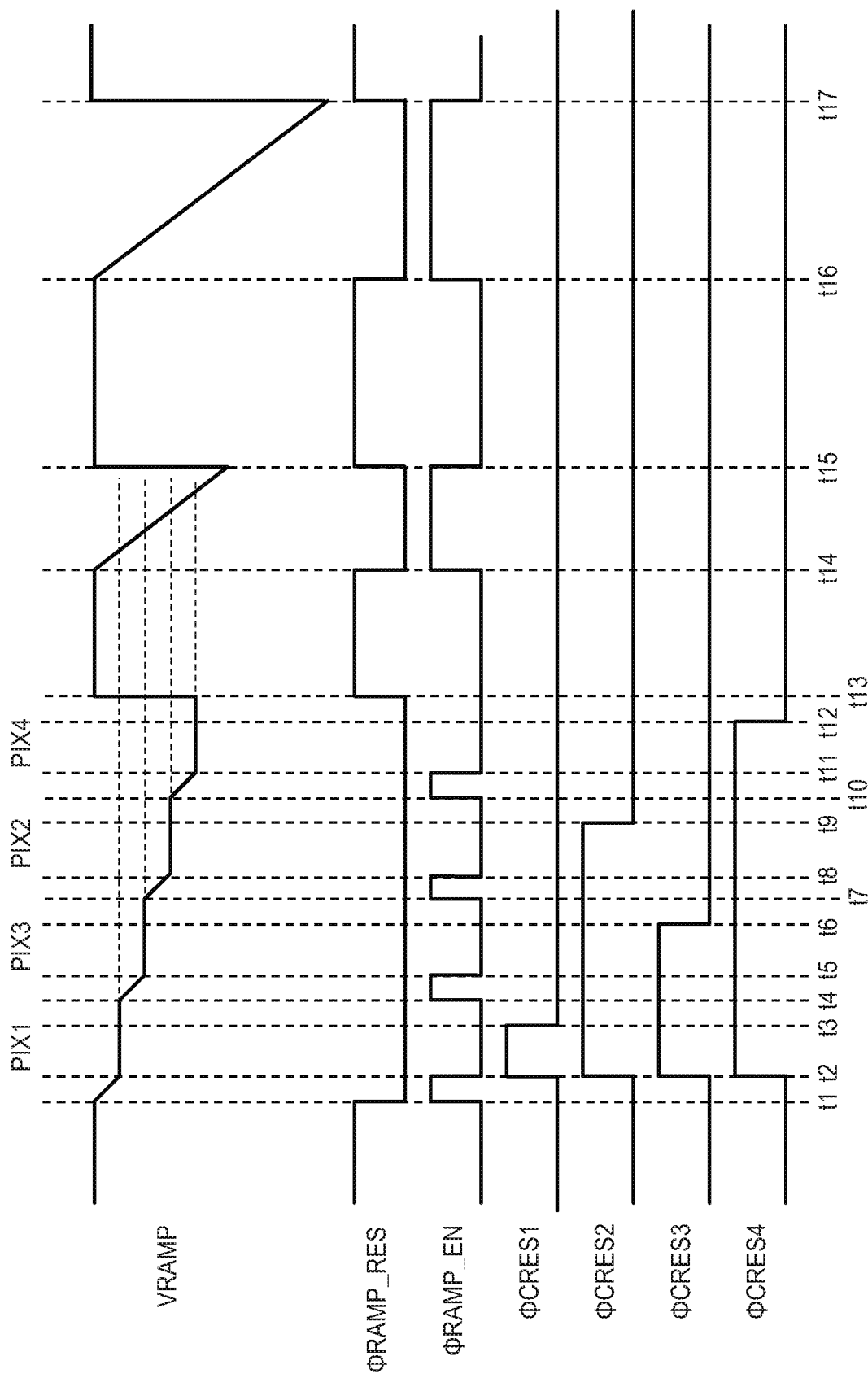
FIG. 4 is a timing diagram illustrating a method of driving the photoelectric conversion device according to the first embodiment of the present invention.

Next, the operation of the AD conversion circuit unit 30A in the photoelectric conversion device according to the present embodiment will be described in more detail with reference to FIG. 3 and FIG. 4. First, before describing a method of driving the photoelectric conversion device according to the present embodiment, a method of driving a photoelectric conversion device according to a reference example will be described with reference to FIG. 3. FIG. 3 is a timing diagram illustrating the method of driving the photoelectric conversion device according to the reference example.

FIG. 3 illustrates signal levels of the reference signal VRAMP and the control signals ΦRAMP_RES, ΦRAMP_EN, ΦCRES1, ΦCRES2, ΦCRES3, and ΦCRES4. The control signal ΦRAMP_RES is a reset signal of the reference signal generation circuit 36 supplied from the timing generation circuit 60 to the reference signal generation circuit 36. When the control signal ΦRAMP_RES is controlled to the High level, the reference signal generation circuit 36 is in a reset state, the output of the reference signal generation circuit 36 becomes at a reference level. Further, the control signal ΦRAMP_EN is an enable signal for the reference signal VRAMP, and when the control signal ΦRAMP_EN is at the High level, the signal level of the reference signal VRAMP changes as time elapses.

In the initial state before time t1, the control signal ΦRAMP_RES is at the High level, the control signals ΦRAMP_EN, ΦCRES1, ΦCRES2, ΦCRES3, and ΦCRES4 are at the Low level. The reference signal VRAMP is at a reference voltage level in accordance with the High level control signal ΦRAMP_RES.

First, at time t1, the timing generation circuit 60 controls the control signal ΦRAMP_RES from the High level to the Low level. Thereby, the reset state of the reference signal generation circuit 36 is released.

Further, at the same time t1, the timing generation circuit 60 controls the control signal ΦRAMP_EN from the Low level to the High level. Thereby, the voltage level of the reference signal VRAMP gradually changes (decreases) from the reference voltage level as time elapses.

Next, at time t2, the timing generation circuit 60 controls the control signal ΦRAMP_EN from the High level to the Low level. Accordingly, the voltage level of the reference signal VRAMP no longer changes, and the reference signal VRAMP becomes constant at a first voltage level that is lower than the reference level.

Further, at the same time t2, the timing generation circuit 60 controls the control signals ΦCRES1, ΦCRES2, ΦCRES3, and ΦCRES4 from the Low level to the High level. Thereby, the transistors M1 and M2 of the comparator circuit 32 are turned on, the input terminal and the output terminal thereof are short-circuited, and thereby the comparator circuit 32 enters a reset state.

Next, at time t3, the timing generation circuit 60 controls the control signal ΦCRES1 from the High level to the Low level. Thereby, the first voltage level is clamped as an offset level to the comparator circuit 32 on a column supplied with the control signal ΦCRES1. At this time, the pixel signal PIX corresponding to a noise amount is output to the output line 16A, and the threshold voltage of the comparator circuit 32 on the column supplied with the control signal ΦCRES1 is reset to a voltage corresponding to a potential difference between the level of the pixel signal PIX1 and the first voltage level.

Next, at time t4, the timing generation circuit 60 controls the control signal ΦRAMP_EN from the Low level to the High level. Thereby, the voltage level of the reference signal VRAMP gradually changes (decreases) from the first voltage level as time elapses.

Next, at time t5, the timing generation circuit 60 controls the control signal ΦRAMP_EN from the High level to the Low level. Accordingly, the voltage level of the reference signal VRAMP no longer changes, and the reference signal VRAMP becomes constant at a second voltage level that is lower than the first voltage level.

Next, at time t6, the timing generation circuit 60 controls the control signal ΦCRES2 from the High level to the Low level. Thereby, the second voltage level is clamped as an offset level to the comparator circuit 32 on a column supplied with the control signal ΦCRES2. At this time, the pixel signal PIX corresponding to a noise amount is output to the output line 16A, and the threshold voltage of the comparator circuit 32 on the column supplied with the control signal ΦCRES2 is reset to a voltage corresponding to a potential difference between the level of the pixel signal PIX2 and the second voltage level.

Next, at time t7, the timing generation circuit 60 controls the control signal ΦRAMP_EN from the Low level to the High level. Thereby, the voltage level of the reference signal VRAMP gradually changes (decreases) from the second voltage level as time elapses.

Next, at time t8, the timing generation circuit 60 controls the control signal ΦRAMP_EN from the High level to the Low level. Accordingly, the voltage level of the reference signal VRAMP no longer changes, and the reference signal VRAMP becomes constant at a third voltage level that is lower than the second voltage level.

Next, at time t9, the timing generation circuit 60 controls the control signal ΦCRES3 from the High level to the Low level. Thereby, the third voltage level is clamped as an offset level to the comparator circuit 32 on a column supplied with the control signal ΦCRES3. At this time, the pixel signal PIX corresponding to a noise amount is output to the output line 16A, and the threshold voltage of the comparator circuit 32 on the column supplied with the control signal ΦCRES3 is reset to a voltage corresponding to a potential difference between the level of the pixel signal PIX3 and the third voltage level.

Next, at time t10, the timing generation circuit 60 controls the control signal ΦRAMP_EN from the Low level to the High level. Thereby, the voltage level of the reference signal VRAMP gradually changes (decreases) from the third voltage level as time elapses.

Next, at time t11, the timing generation circuit 60 controls the control signal ΦRAMP_EN from the High level to the Low level. Accordingly, the voltage level of the reference signal VRAMP no longer changes, and the reference signal VRAMP becomes constant at a fourth voltage level that is lower than the third voltage level.

Next, at time t12, the timing generation circuit 60 controls the control signal ΦCRES4 from the High level to the Low level. Thereby, the fourth voltage level is clamped as an offset level to the comparator circuit 32 on a column supplied with the control signal ΦCRES4. At this time, the pixel signal PIX corresponding to a noise amount is output to the output line 16A, and the threshold voltage of the comparator circuit 32 on the column supplied with the control signal ΦCRES4 is reset to a voltage corresponding to a potential difference between the level of the pixel signal PIX4 and the fourth voltage level.

Next, at time t13, the timing generation circuit 60 controls the control signal ΦRAMP_RES from the Low level to the High level. Thereby, the reference signal generation circuit 36 enters a reset state, and the voltage level of the reference signal returns to the reference level.

Next, at time t14, the timing generation circuit 60 controls the control signal ΦRAMP_RES from the High level to the Low level. Thereby, the reset state of the reference signal generation circuit 36 is released.

Next, at the same time t14, the timing generation circuit 60 controls the control signal ΦRAMP_EN from the Low level to the High level. Thereby, the voltage level of the reference signal VRAMP gradually changes (decreases) from the reference level as time elapses.

The period from time t14 to time t15 is a period in which AD conversion is performed on the pixel signals PIX1, PIX2, PIX3, and PIX4 corresponding to noise amounts.

When the voltage level of the reference signal VRAMP reaches the first voltage level, the potential difference between the level of the pixel signal PIX1 and the reference signal VRAMP becomes the threshold voltage of the comparator circuit 32 on the column of interest, and the level of the output signal of the comparator circuit 32 is inverted. The memory 42 on the column of interest holds, as digital data of the pixel signal PIX1, the count value in accordance with the count signal receiving from the counter 44A at a timing when the level of the output signal of the comparator circuit 32 is inverted.

When the voltage level of the reference signal VRAMP further decreases and reaches the second voltage level, the potential difference between the level of the pixel signal PIX2 and the reference signal VRAMP becomes the threshold voltage of the comparator circuit 32 on the column of interest, and the level of the output signal of the comparator circuit 32 is inverted. The memory 42 on the column of interest holds, as digital data of the pixel signal PIX2, the count value in accordance with the count signal receiving from the counter 44A at a timing when the level of the output signal of the comparator circuit 32 is inverted.

When the voltage level of the reference signal VRAMP further decreases and reaches the third voltage level, the potential difference between the level of the pixel signal PIX3 and the reference signal VRAMP becomes the threshold voltage of the comparator circuit 32 on the column of interest, and the level of the output signal of the comparator circuit 32 is inverted. The memory 42 on the column of interest holds, as digital data of the pixel signal PIX3, the count value in accordance with the count signal receiving from the counter 44A at a timing when the level of the output signal of the comparator circuit 32 is inverted.

When the voltage level of the reference signal VRAMP further decreases and reaches the fourth voltage level, the potential difference between the level of the pixel signal PIX4 and the reference signal VRAMP becomes the threshold voltage of the comparator circuit 32 on the column of interest, and the level of the output signal of the comparator circuit 32 is inverted. The memory 42 on the column of interest holds, as digital data of the pixel signal PIX4, the count value in accordance with the count signal receiving from the counter 44A at a timing when the level of the output signal of the comparator circuit 32 is inverted.

Next, at time t15, the timing generation circuit 60 controls the control signal ΦRAMP_EN from the High level to the Low level and controls the control signal ΦRAMP_RES from the Low level to the High level. Thereby, the reference signal generation circuit 36 enters a reset state, and the voltage level of the reference signal returns to the reference level.

Next, at time t16, the timing generation circuit 60 controls the control signal ΦRAMP_RES from the High level to the Low level. Thereby, the reset state of the reference signal generation circuit 36 is released.

Further, at the same time t16, the timing generation circuit 60 controls the control signal ΦRAMP_EN from the Low level to the High level. Thereby, the voltage level of the reference signal VRAMP gradually changes (decreases) from the reference level as time elapses.

The period from time t16 to time t17 is a period in which AD conversion is performed on the pixel signals PIX1, PIX2, PIX3, and PIX4 corresponding to the signal amount in accordance with the incident light amount. The reference signal VRAMP supplied from the reference signal generation circuit 36A at this time is a ramp signal corresponding to an optical signal amplitude.

Next, at time t17, the timing generation circuit 60 controls the control signal ΦRAMP_EN from the High level to the Low level and controls the control signal ΦRAMP_RES from the Low level to the High level. Thereby, the reference signal generation circuit 36 enters a reset state, and the voltage level of the reference signal returns to the reference level.

By performing the driving in accordance with the timing diagram of FIG. 3 in such a way, it is possible to generate a plurality of offset levels and hold the offset levels in the comparator circuits 32, and it is possible to suppress the output states of all the comparator circuits 32 from being simultaneously inverted. As a result, it is possible to reduce noise due to IR drop or current fluctuation in response to simultaneous inversion of the output states of the comparator circuits 32 and thus improve image quality.

In the drive method according to the reference example, however, color mixture may occur due to order of performing AD conversion, and this may reduce image quality.

In the drive method according to the reference example, in the period from time t14 to time t15, the AD conversion of the pixel signals PIX1, PIX2, PIX3, and PIX4 corresponding to noise amounts is performed in this order. When this order is associated with the pixel arrangement of FIG. 1, AD conversion of the pixel signal PIX is performed in the order of R1 pixels, B1 pixels, R2 pixels, and B2 pixels in the AD conversion circuit unit 30A.

In such order, kickback noise may occur when AD conversion of a pixel signal of an R2 pixel is performed after AD conversion of a pixel signal of a B1 pixel is performed. The kickback noise is noise due to simultaneous inversion of the output states of the comparator circuits 32 on a corresponding column. That is, when the output states of the comparator circuits 32 on columns corresponding to B1 pixels are simultaneously inverted, potential fluctuation due to IR drop or the like may occur. At this time, instantaneous potential fluctuation occurs at a portion capacitively coupled to the output part of the comparator circuit 32, and this affects the signal level of another signal line. By being influenced by such kickback noise via a common interconnection, AD conversion data of R2 pixels on which AD conversion is next performed may change from a value which would otherwise be obtained. This influence causes a part of an image to color in red, and image quality deterioration occurs.

Note that kickback noise may occur also when AD conversion of a pixel signal of a B1 pixel is performed after AD conversion of a pixel signal of an R1 pixel is performed or when AD conversion of a pixel signal of a B2 pixel is performed after AD conversion of a pixel signal of an R2 pixel is performed. In such a case, although image quality deterioration in which a part of an image colors in blue may occur, since visibility of coloring in blue is low in general, influence on image quality is relatively small.

Next, a method of driving the photoelectric conversion device according to the present embodiment will be described with reference to FIG. 4. Note that description will be provided here mainly for features different from the method of driving the photoelectric conversion device according to the reference example, and description of the same features as those in the method of driving the photoelectric conversion device according to the reference example will be omitted or simplified as appropriate. FIG. 4 is a timing diagram illustrating the method of driving the photoelectric conversion device according to the present embodiment. FIG. 4 illustrates signal levels of the reference signal VRAMP and the control signals ΦRAMP_RES, ΦRAMP_EN, ΦCRES1, ΦCRES2, ΦCRES3, and ΦCRES4 in the same manner as in FIG. 3.

The method of driving the photoelectric conversion device according to the present embodiment is the same as the method of driving the photoelectric conversion device according to the reference example except for a difference in the timing of transition of the control signals ΦCRES2 and ΦCRES3 from the High level to the Low level.

That is, at time t6, the timing generation circuit 60 controls the control signal ΦCRES3, instead of the control signal ΦCRES2, from the High level to the Low level. Thereby, the second voltage level is clamped as the offset level to the comparator circuit 32 on a column supplied with the control signal ΦCRES3. At this time, the pixel signal PIX corresponding to a noise amount is being output to the output line 16A, and the threshold voltage of the comparator circuit 32 on a column supplied with the control signal ΦCRES3 is reset to a voltage corresponding to the potential difference between the level of the pixel signal PIX3 and the second voltage level.

Further, at time t9, the timing generation circuit 60 controls the control signal ΦCRES2, instead of the control signal ΦCRES3, from the High level to the Low level. Thereby, the third voltage level is clamped as the offset level to the comparator circuit 32 on a column supplied with the control signal ΦCRES2. At this time, the pixel signal PIX corresponding to a noise amount is being output to the output line 16A, and the threshold voltage of the comparator circuit 32 on a column supplied with the control signal ΦCRES2 is reset to a voltage corresponding to the potential difference between the level of the pixel signal PIX2 and the third voltage level.

Accordingly, the threshold voltages of the comparator circuits 32 changes stepwise in the order of the comparator circuit 32 supplied with the pixel signal PIX1, the comparator circuit 32 supplied with the pixel signal PIX3, the comparator circuit 32 supplied with the pixel signal PIX2, and the comparator circuit 32 supplied with the pixel signal PIX4.

As a result, AD conversion of the pixel signal PIX corresponding to a noise amount in the period from time t14 to time t15 is performed in the order to the pixel signals PIX1, PIX3, PIX2, and PIX4. When this order is associated with the pixel arrangement of FIG. 1, AD conversion of the pixel signal PIX is performed in the order of R1 pixels, R2 pixels, B1 pixels, and B2 pixels in the AD conversion circuit unit 30A.

That is, in the drive method according to the reference example, the number of times that AD conversion of a pixel signal of a B pixel is performed after AD conversion of a pixel signal of an R pixel is performed is two, and the number of times that AD conversion of a pixel signal of an R pixel is performed after AD conversion of a pixel signal of a B pixel is performed is one. In contrast, in the drive method according to the present embodiment, the number of times that AD conversion of a pixel signal of a B pixel is performed after AD conversion of a pixel signal of an R pixel is performed is one, and the number of times that AD conversion of a pixel signal of an R pixel is performed after AD conversion of a pixel signal of a B pixel is performed is zero.

That is, the drive method of the present embodiment is a drive method that minimizes influence of color mixture when the offset levels are classified into four values. Further, in the drive method according to the present embodiment, with the configuration of performing AD conversion of the pixel signal of B pixels after performing AD conversion of the pixel signal of R pixels, influence of color mixture on the pixel having high spectral sensitivity is reduced not to make the color mixture noticeable. Therefore, according to the drive method of the present embodiment, it is possible to suppress influence due to color mixture and improve image quality.

Note that, although the offset level is classified into four values in the present embodiment, more than four values of offset levels can be held by the same method. For example, the offset level may be set into six values, and AD conversion of pixel signals may be performed in the order of R pixels, R pixels, R pixels, B pixels, B pixels, and B pixels.

As described above, according to the present embodiment, a photoelectric conversion device including comparator circuits having high comparison accuracy and the drive method thereof can be realized. Accordingly, influence due to color mixture can be suppressed, and image quality can be improved.

Second Embodiment

Figure 5:
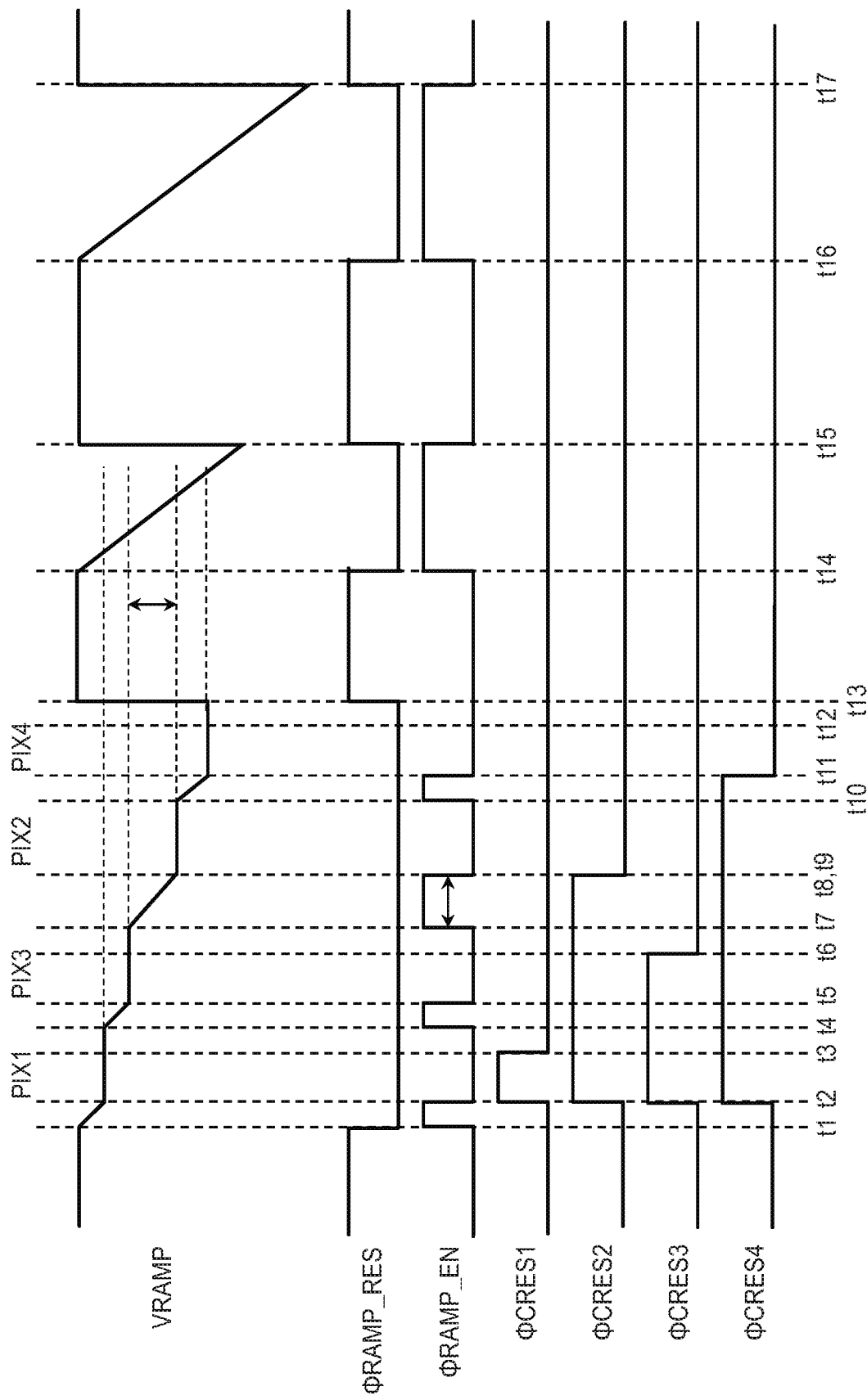
FIG. 5 is a timing diagram illustrating a method of driving a photoelectric conversion device according to a second embodiment of the present invention.

A photoelectric conversion device and a method of driving the same according to a second embodiment of the present invention will be described with reference to FIG. 5. The same components as those of the photoelectric conversion device according to the first embodiment are labeled with the same references, and the description thereof will be omitted or simplified. FIG. 5 is a timing diagram illustrating the method of driving the photoelectric conversion device according to the present embodiment.

In the present embodiment, another method of driving the photoelectric conversion device according to the first embodiment will be described. The drive method of the present embodiment is the same as the drive method of the first embodiment illustrated in FIG. 4 except for a difference in the length of the period from time t7, which is the time the control signal ΦRAMP_EN is controlled to the High level, to time t8 as illustrated in FIG. 5.

That is, in the present embodiment, the length of the period from time t7, which is the time the control signal ΦRAMP_EN is controlled to the High level, to time t8 is longer than the length of the period from time t4 to time t5 and the length of the period from time t10 to time t11.

The period from time t7 to time t8 is a period in which the voltage level of the reference signal VRAMP is controlled to transition from the second voltage level to the third voltage level. When this period is increased, the potential difference between the second voltage level and the third voltage level is increased. Therefore, at AD conversion of the pixel signal PIX in the period from time t14 to time t15, the time difference between a timing of AD conversion of the pixel signal PIX3 and a timing of AD conversion of the pixel signal PIX2 can be longer than that in the case of the first embodiment.

Herein, kickback noise occurring at AD conversion of the pixel signal PIX3 of an R pixel converges as time elapses. Therefore, by increasing the time difference between the timing of AD conversion of the pixel signal PIX3 and the timing of AD conversion of the pixel signal PIX2, it is possible to reduce kickback noise due to an R pixel when AD conversion of the pixel signal PIX2 of a B pixel is performed. Therefore, according to the drive method of the present embodiment, it is possible to further suppress influence due to color mixture and improve image quality.

As described above, according to the present embodiment, a photoelectric conversion device including comparator circuits having high comparison accuracy and the drive method thereof can be realized. Accordingly, influence due to color mixture can be suppressed, and image quality can be improved.

Third Embodiment

Figure 6:
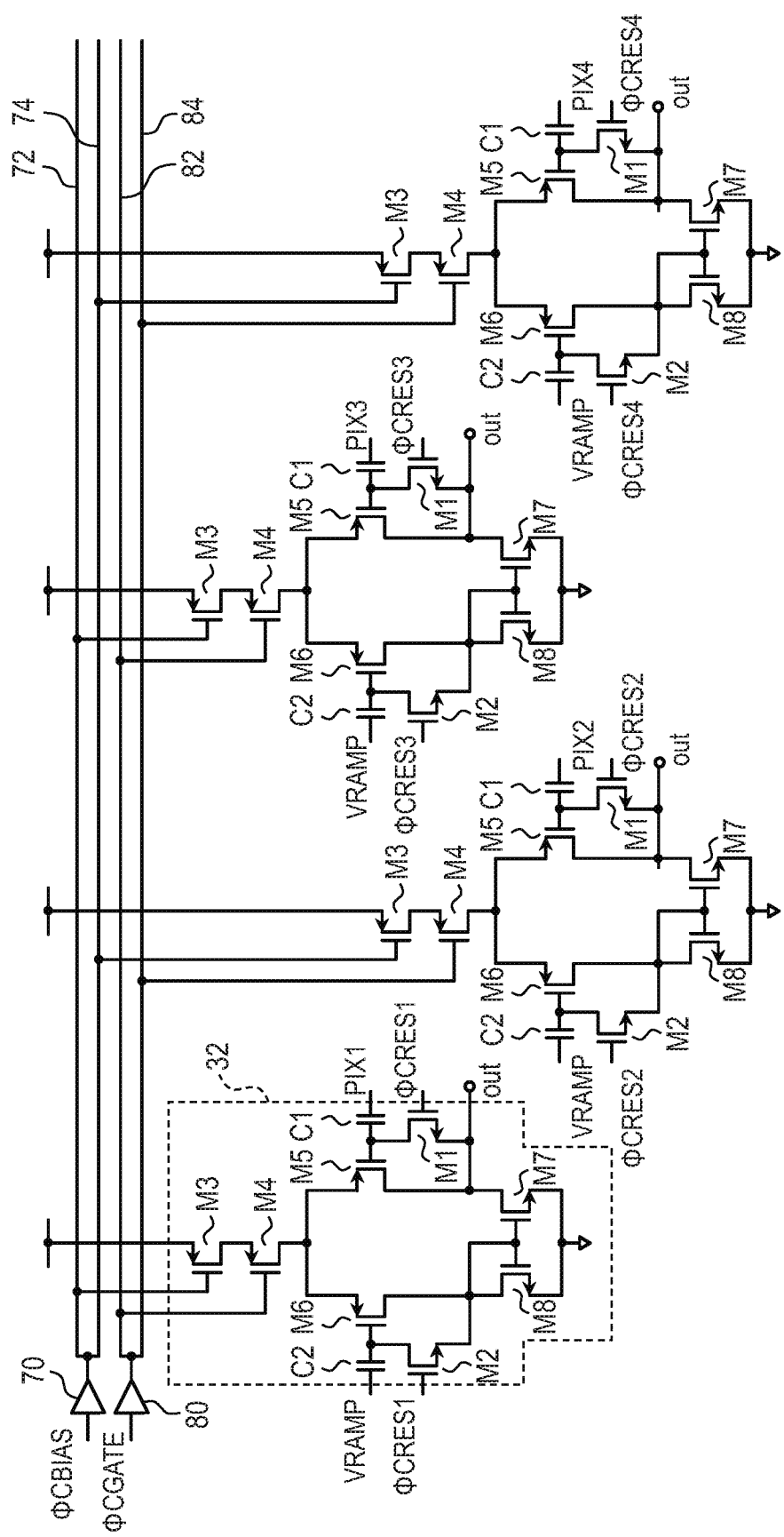
FIG. 6 is a circuit diagram illustrating a configuration example of a comparator circuit in a photoelectric conversion device according to a third embodiment of the present invention.

A photoelectric conversion device and a method of driving the same according to a third embodiment of the present invention will be described with reference to FIG. 6. The same components as those of the photoelectric conversion device according to the first and second embodiments are labeled with the same references, and the description thereof will be omitted or simplified. FIG. 6 is a circuit diagram illustrating a configuration example of the comparator circuit in the photoelectric conversion device according to the present embodiment.

As illustrated in FIG. 6, the photoelectric conversion device according to the present embodiment is different from the photoelectric conversion device according to the first embodiment in the circuit configuration of the comparator circuits 32.

That is, as illustrated in FIG. 6, each of the comparator circuits 32 of the photoelectric conversion device according to the present embodiment further includes transistors M3, M4, M5, M6, M7, and M8 in addition to the transistors M1 and M2 and the input capacitors C1 and C2. The transistors M3 to M8 correspond to the differential pair circuit 34 of FIG. 2. FIG. 6 illustrates the comparator circuits 32 each formed of a differential pair circuit with PMOS input. In such a case, the transistors M1, M2, M7, and M8 are formed of n-channel MOS transistors, and the transistors M3, M4, M5, and M6 are formed of p-channel MOS transistors. Note that the comparator circuit 32 can also be formed of a differential pair circuit with NMOS input.

The transistor M5 is an input transistor on a side to which the pixel signal PIX is input, and the transistor M6 is an input transistor on a side to which the reference signal VRAMP is input. The drain of the transistor M5 is the output terminal "out" of the comparator circuit 32.

The transistors M3 and M4 form a tail current source of the differential pair circuit. That is, the tail current source of the differential pair circuit is formed of two stages of the transistor M3 used for a current source and the gate grounded transistor M4. The source of the transistor M3 is connected to a power source node. The drain of the transistor M3 is connected to the source of the transistor M4. The drain of the transistor M4 is connected to the source of the transistor M5 and the source of the transistor M6. A control signal ΦCBIAS is supplied to the gate of the transistor M3 via a buffer circuit 70. Further, a control signal ΦCGATE is supplied to the gate of the transistor M4 via a buffer circuit 80.

The drain of the transistor M5 is connected to the drain of the transistor M7. The drain of the transistor M6 is connected to the gate of the transistor M7 and the drain and gate of the transistor M8. The source of the transistor M7 and the source of the transistor M8 are connected to a reference voltage (ground) node.

The transistor M1 is connected between the gate of the transistor M5 corresponding to the − input terminal and the drain of the transistor M5 corresponding to + output terminal in FIG. 2. The transistor M2 is connected between the gate of the transistor M6 corresponding to the + input terminal and the drain of the transistor M6 corresponding to − output terminal in FIG. 2.

In typical photoelectric conversion devices, each of an interconnection used for supplying the control signal ΦCBIAS to the comparator circuit 32 on each column and an interconnection used for supplying the control signal ΦCGATE to the comparator circuit 32 on each column is typically an interconnection common to all the columns.

On the other hand, in the photoelectric conversion device according to the present embodiment, two interconnections used for supplying the control signal ΦCBIAS and two interconnection used for supplying the control signal ΦCGATE are provided, and these two interconnections are allocated for a signal line for R pixels and a signal line for B pixels.

Specifically, two interconnections 72 and 74 connected to the buffer circuit 70 and arranged in the row direction (column scan direction) are provided. The interconnection 72 is connected to the comparator circuits 32 on columns corresponding to R pixels (corresponding to a column to which the pixel signal PIX1 is output and a column to which the pixel signal PIX3 is output). Further, the interconnection 74 is connected to the comparator circuits 32 on columns corresponding to B pixels (corresponding to a column to which the pixel signal PIX2 is output and a column to which the pixel signal PIX4 is output).

Further, two interconnections 82 and 84 connected to the buffer circuit 80 and arranged in the row direction (column scan direction) are provided. The interconnection 82 is connected to the comparator circuits 32 on columns corresponding to R pixels (corresponding to a column to which the pixel signal PIX1 is output and a column to which the pixel signal PIX3 is output). The interconnection 84 is connected to the comparator circuits 32 on columns corresponding to B pixels (corresponding to a column to which the pixel signal PIX2 is output and a column to which the pixel signal PIX4 is output).

With such a configuration, a control line that may be a propagation path of kickback noise can be divided into an interconnection for R pixels and an interconnection for B pixels, and color mixture between the R pixels and the B pixels is much less likely to occur. In such a configuration, not only suppression of color mixture but also a reduction effect against streaking such as smear is expected.

As described above, according to the present embodiment, a photoelectric conversion device including comparator circuits having high comparison accuracy and the drive method thereof can be realized. Accordingly, influence due to color mixture can be suppressed, and image quality can be improved.

Fourth Embodiment

Figure 7:
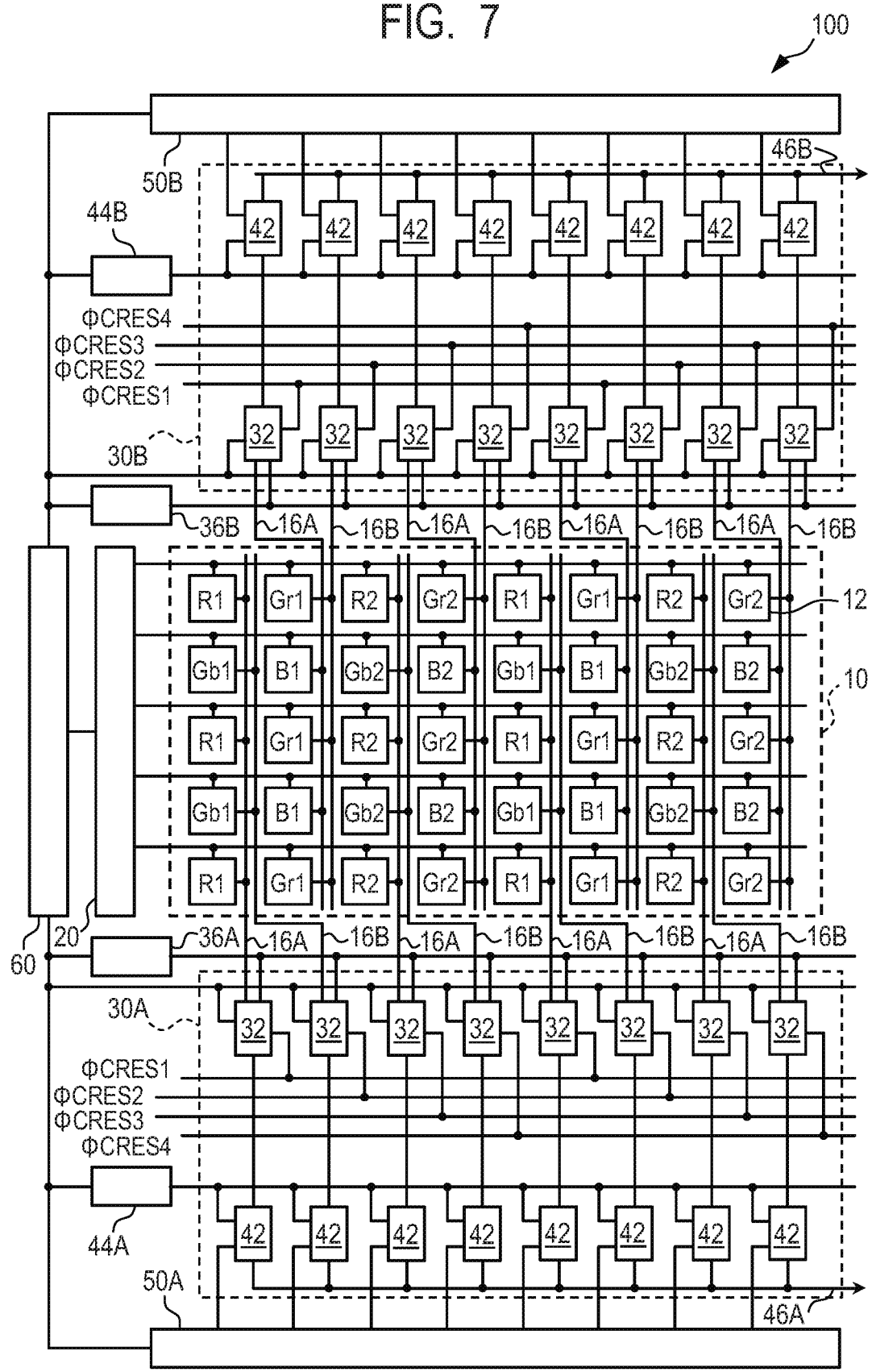
FIG. 7 is a block diagram illustrating a general configuration of a photoelectric conversion device according to a fourth embodiment of the present invention.
Figure 8:
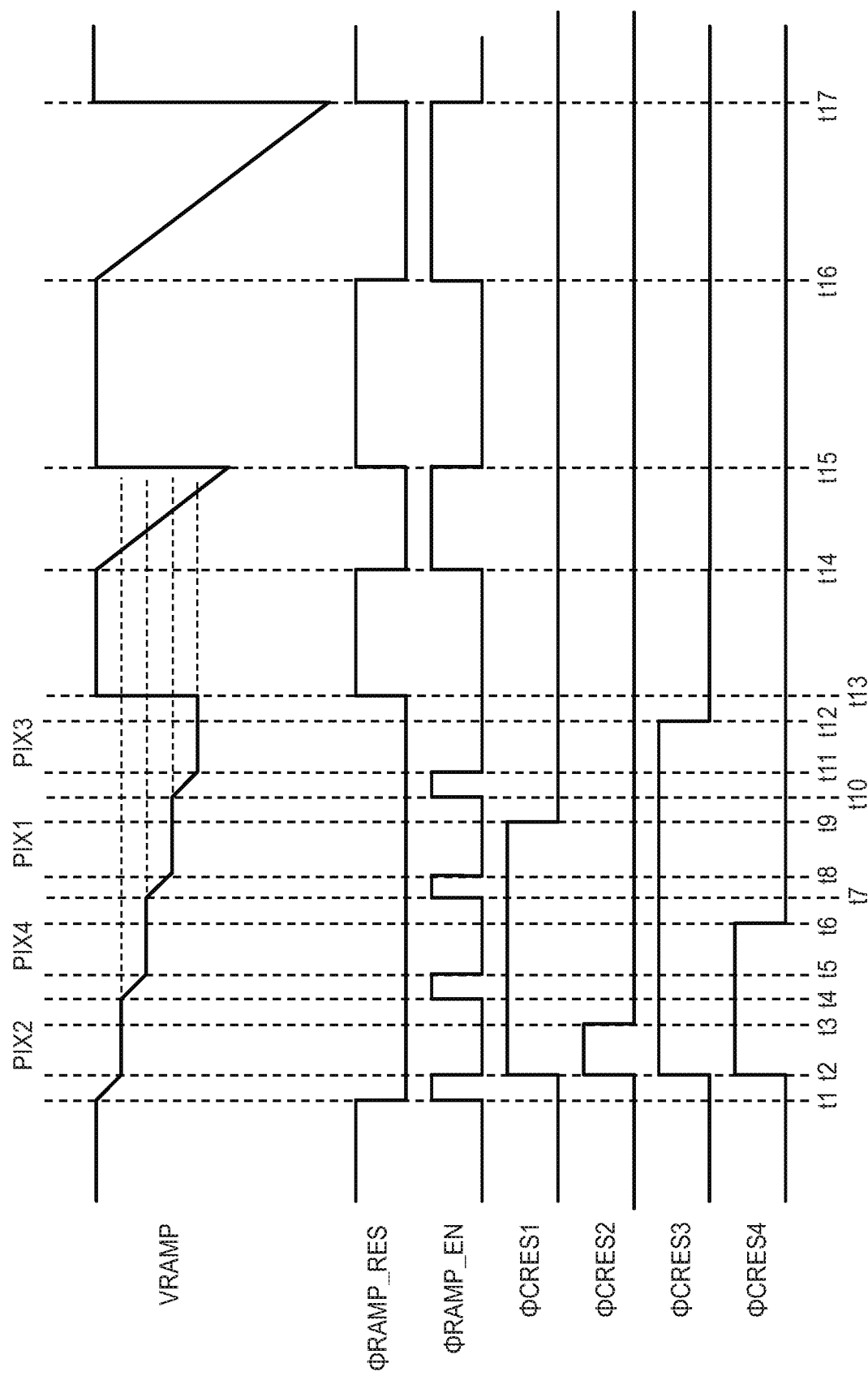
FIG. 8 is a timing diagram illustrating a method of driving the photoelectric conversion device according to the fourth embodiment of the present invention.

A photoelectric conversion device and a method of driving the same according to a fourth embodiment of the present invention will be described with reference to FIG. 7 and FIG. 8. The same components as those of the photoelectric conversion device according to the first to third embodiments are labeled with the same references, and the description thereof will be omitted or simplified. FIG. 7 is a block diagram illustrating the general configuration of the photoelectric conversion device according to the present embodiment. FIG. 8 is a timing diagram illustrating the drive method of the photoelectric conversion device according to the present embodiment.

The photoelectric conversion device according to the present embodiment is different from the photoelectric conversion device according to the first to third embodiments in the comparator circuits 32 controlled by the control signals ΦCRES1, ΦCRES2, ΦCRES3, and ΦCRES4.

That is, in the photoelectric conversion device according to the present embodiment, as illustrated in FIG. 7, R1 pixels and R2 pixels are connected to the comparator circuits 32 of the AD conversion circuit unit 30A via the output lines 16A. Gb1 pixels and Gb2 pixels are connected to the comparator circuits 32 of the AD conversion circuit unit 30A via the output lines 16B. B1 pixels and B2 pixels are connected to the comparator circuits 32 of the AD conversion circuit unit 30B via the output lines 16A. Gr1 pixels and Gr2 pixels are connected to the comparator circuits 32 of the AD conversion circuit unit 30B via the output lines 16B. In each of the AD conversion circuit units 30A and 30B, the comparator circuits 32 connected to the output lines 16A and the comparator circuits 32 connected to the output lines 16B are arranged alternately.

In the AD conversion circuit unit 30A, the pixels 12 connected to the comparator circuits 32 controlled by the control signal ΦCRES1 are R1 pixels. In the AD conversion circuit unit 30A, the pixels 12 connected to the comparator circuits 32 controlled by the control signal ΦCRES2 are Gb1 pixels. In the AD conversion circuit unit 30A, the pixels 12 connected to the comparator circuits 32 controlled by the control signal ΦCRES3 are R2 pixels. In the AD conversion circuit unit 30A, the pixels 12 connected to the comparator circuits 32 controlled by the control signal ΦCRES4 are Gb2 pixels.

Further, in the AD conversion circuit unit 30B, the pixels 12 connected to the comparator circuits 32 controlled by the control signal ΦCRES1 are B1 pixels. In the AD conversion circuit unit 30B, the pixels 12 connected to the comparator circuits 32 controlled by the control signal ΦCRES2 are Gr1 pixels. In the AD conversion circuit unit 30B, the pixels 12 connected to the comparator circuits 32 controlled by the control signal ΦCRES3 are B2 pixels. In the AD conversion circuit unit 30B, the pixels 12 connected to the comparator circuits 32 controlled by the control signal ΦCRES4 are Gr2 pixels.

Note that the control signals ΦCRES1, ΦCRES2, ΦCRES3, and ΦCRES4 supplied to the AD conversion circuit unit 30A may be the same as or different from the control signals ΦCRES1, ΦCRES2, ΦCRES3, and ΦCRES4 supplied to the AD conversion circuit unit 30B.

Next, the operation of the photoelectric conversion device according to the present embodiment will be described with reference to FIG. 8. Although description is provided here with an example of the AD conversion circuit unit 30A, the same applies to the AD conversion circuit unit 30B. FIG. 8 illustrates signal levels of the reference signal VRAMP and the control signals ΦRAMP_RES, ΦRAMP_EN, ΦCRES1, ΦCRES2, ΦCRES3, and ΦCRES4 in the same manner as in FIG. 3.

Herein, an R1 pixel outputs the pixel signal PIX1 to the comparator circuit 32 controlled by the control signal ΦCRES1. A Gb1 pixel outputs the pixel signal PIX2 to the comparator circuit 32 controlled by the control signal ΦCRES2. An R2 pixel outputs the pixel signal PIX3 to the comparator circuit 32 controlled by the control signal ΦCRES3. A Gb2 pixel outputs the pixel signal PIX4 to the comparator circuit 32 controlled by the control signal ΦCRES4.

A Gb1 pixel and a Gb2 pixel have higher spectral sensitivity than an R1 pixel and an R2 pixel. It is therefore desirable that AD conversion of the reset levels of the pixel signal PIX2 of Gb1 pixels and the pixel signal PIX4 of Gb2 pixels be performed prior to AD conversion of the reset levels of the pixel signal PIX1 of R1 pixels and the pixel signal PIX3 of R2 pixels. Specifically, as illustrated in FIG. 8, for example, AD conversion of reset levels may be performed in the order of the pixel signals PIX2, PIX4, PIX1, and PIX3. When this order is associated with the pixel arrangement of FIG. 7, AD conversion of the pixel signal PIX is performed in the order of Gb1 pixels, Gb2 pixels, R1 pixels, and R2 pixels in the AD conversion circuit unit 30A. By performing driving in such order, it is possible to reduce influence of color mixture for pixels having high spectral sensitivity not to make color mixture noticeable as with the first embodiment.

The AD conversion circuit unit 30B may be configured such that AD conversion of the reset levels of the pixel signals of Gr1 pixels and Gr2 pixels, which have higher spectral sensitivity than B1 pixels and B2 pixels, is performed prior to AD conversion of the reset levels of the pixel signals of B1 pixels and the B2 pixels.

As described above, according to the present embodiment, a photoelectric conversion device including comparator circuits having high comparison accuracy and the drive method thereof can be realized. Accordingly, influence due to color mixture can be suppressed, and image quality can be improved.

Fifth Embodiment

Figure 9:
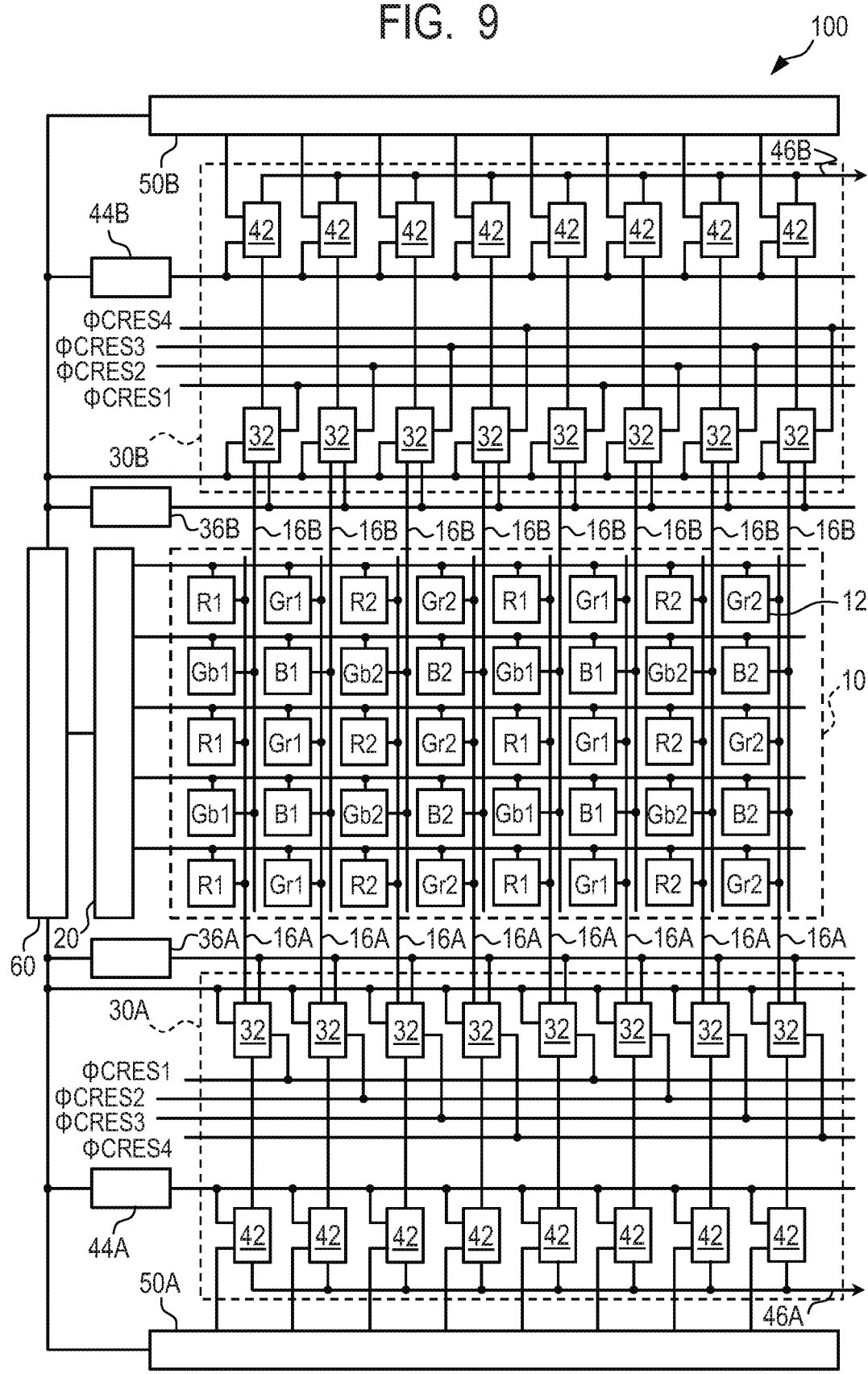
FIG. 9 is a block diagram illustrating a general configuration of a photoelectric conversion device according to a fifth embodiment of the present invention.

A photoelectric conversion device and a method of driving the same according to a fifth embodiment of the present invention will be described with reference to FIG. 9. The same components as those of the photoelectric conversion device according to the first to fourth embodiments are labeled with the same references, and the description thereof will be omitted or simplified. FIG. 9 is a block diagram illustrating the general configuration of the photoelectric conversion device according to the present embodiment.

The photoelectric conversion device according to the present embodiment is different from the photoelectric conversion device according to the first to fourth embodiments in the comparator circuits 32 controlled by the control signals ΦCRES1, ΦCRES2, ΦCRES3, and ΦCRES4.

That is, in the photoelectric conversion device according to the present embodiment, as illustrated in FIG. 9, R1 pixels, R2 pixels, Gr1 pixels, and Gr2 pixels are connected to the comparator circuits 32 of the AD conversion circuit unit 30A via the output lines 16A. B1 pixels, B2 pixels, Gb1 pixels, and Gb2 pixels are connected to the comparator circuits 32 of the AD conversion circuit unit 30B via the output lines 16B.

In the AD conversion circuit unit 30A, the pixels 12 connected to the comparator circuits 32 controlled by the control signal ΦCRES1 are R1 pixels. In the AD conversion circuit unit 30A, the pixels 12 connected to the comparator circuits 32 controlled by the control signal ΦCRES2 are Gr1 pixels. In the AD conversion circuit unit 30A, the pixels 12 connected to the comparator circuits 32 controlled by the control signal ΦCRES3 are R2 pixels. In the AD conversion circuit unit 30A, the pixels 12 connected to the comparator circuits 32 controlled by the control signal ΦCRES4 are Gr2 pixels.

Further, in the AD conversion circuit unit 30B, the pixels 12 connected to the comparator circuits 32 controlled by the control signal ΦCRES1 are Gb1 pixels. In the AD conversion circuit unit 30B, the pixels 12 connected to the comparator circuits 32 controlled by the control signal ΦCRES2 are B1 pixels. In the AD conversion circuit unit 30B, the pixels 12 connected to the comparator circuits 32 controlled by the control signal ΦCRES3 are Gb2 pixels. In the AD conversion circuit unit 30B, the pixels 12 connected to the comparator circuits 32 controlled by the control signal ΦCRES4 are B2 pixels.

Note that the control signals ΦCRES1, ΦCRES2, ΦCRES3, and ΦCRES4 supplied to the AD conversion circuit unit 30A may be the same as or different from the control signals ΦCRES1, ΦCRES2, ΦCRES3, and ΦCRES4 supplied to the AD conversion circuit unit 30B.

Next, the operation of the photoelectric conversion device according to the present embodiment will be described with reference to FIG. 8. Although description is provided here with an example of the AD conversion circuit unit 30A, the same applies to the AD conversion circuit unit 30B.

Herein, an R1 pixel outputs the pixel signal PIX1 to the comparator circuit 32 controlled by the control signal ΦCRES1. A Gr1 pixel outputs the pixel signal PIX2 to the comparator circuit 32 controlled by the control signal ΦCRES2. An R2 pixel outputs the pixel signal PIX3 to the comparator circuit 32 controlled by the control signal ΦCRES3. A Gr2 pixel outputs the pixel signal PIX4 to the comparator circuit 32 controlled by the control signal ΦCRES4.

A Gr1 pixel and a Gr2 pixel have higher spectral sensitivity than an R1 pixel and an R2 pixel. It is therefore desirable that AD conversion of the reset levels of the pixel signal PIX2 of Gr1 pixels and the pixel signal PIX4 of Gr2 pixels be performed prior to AD conversion of the reset levels of the pixel signal PIX1 of R1 pixels and the pixel signal PIX3 of R2 pixels. Specifically, as illustrated in FIG. 8, for example, AD conversion of reset levels may be performed in the order of the pixel signals PIX2, PIX4, PIX1, and PIX3 in the same manner as in the fourth embodiment. When this order is associated with the pixel arrangement of FIG. 9, AD conversion of the pixel signal PIX is performed in the order of Gr1 pixels, Gr2 pixels, R1 pixels, and R2 pixels in the AD conversion circuit unit 30A. By performing driving in such order, it is possible to reduce influence of color mixture for pixels having high spectral sensitivity not to make color mixture noticeable as with the first embodiment.

The AD conversion circuit unit 30B may be configured such that AD conversion of the reset levels of the pixel signals of Gb1 pixels and Gb2 pixels, which have higher spectral sensitivity than B1 pixels and B2 pixels, is performed prior to AD conversion of the reset levels of the pixel signals of B1 pixels and the B2 pixels.

As described above, according to the present embodiment, a photoelectric conversion device including comparator circuits having high comparison accuracy and the drive method thereof can be realized. Accordingly, influence due to color mixture can be suppressed, and image quality can be improved.

Sixth Embodiment

Figure 10:
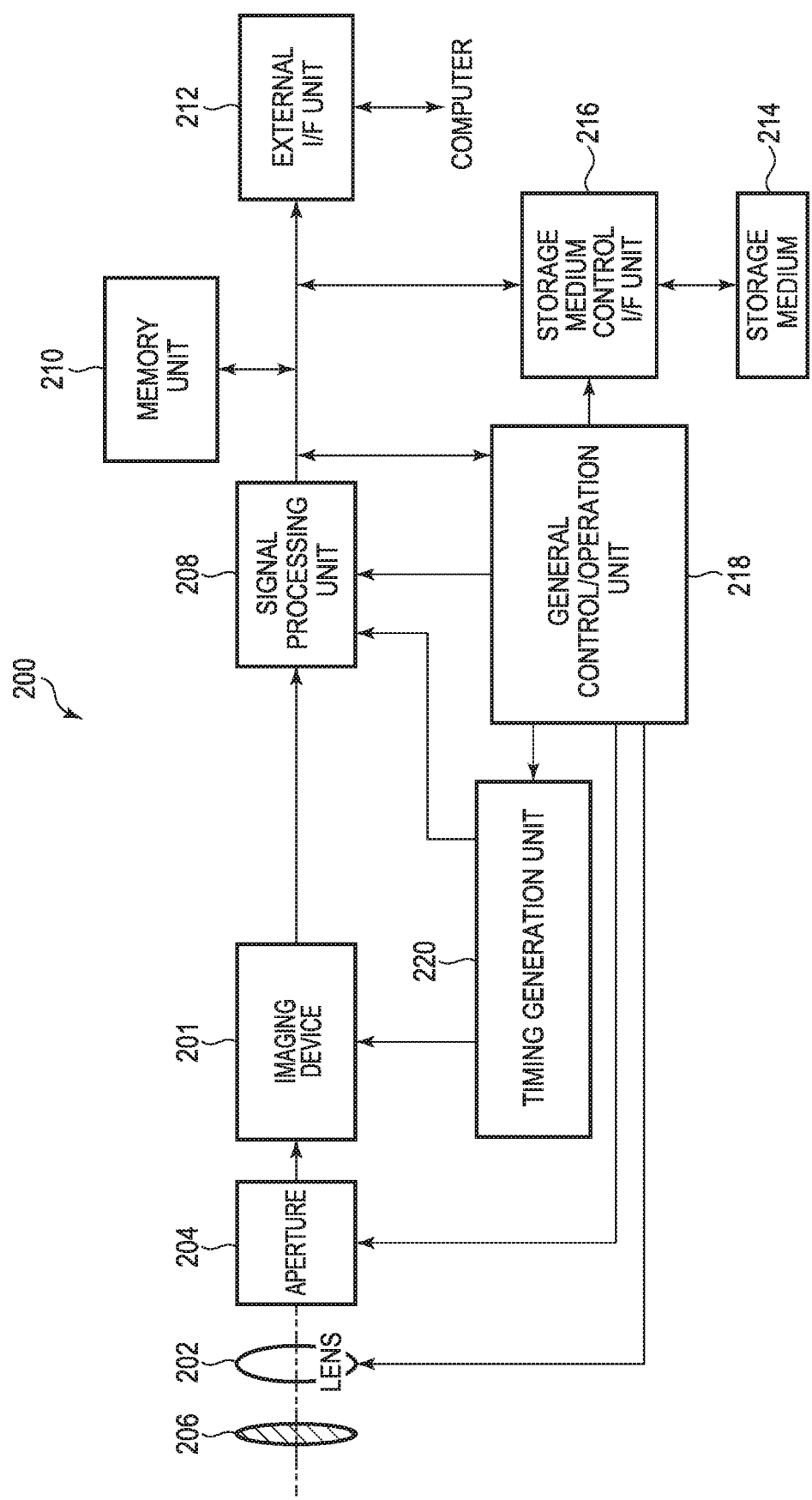
FIG. 10 is a block diagram illustrating a general configuration of an imaging system according to a sixth embodiment of the present invention.

An imaging system according to a sixth embodiment of the present invention will be described with reference to FIG. 10. FIG. 10 is a block diagram illustrating a general configuration of the imaging system according to the present embodiment.

The photoelectric conversion device 100 described in the above first to fifth embodiments can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 10 illustrates a block diagram of a digital still camera as an example out of these examples.

An imaging system 200 illustrated as an example in FIG. 10 includes an imaging device 201, a lens 202 that captures an optical image of a subject onto the imaging device 201, an aperture 204 for changing a light amount passing through the lens 202, and a barrier 206 for protecting the lens 202. The lens 202 and the aperture 204 form an optical system that collects a light onto the imaging device 201. The imaging device 201 is the photoelectric conversion device 100 described in any of the first to fifth embodiments and converts an optical image captured by the lens 202 into image data.

Further, the imaging system 200 includes a signal processing unit 208 that processes an output signal output from the imaging device 201. The signal processing unit 208 generates image data from digital signals output by the imaging device 201. Further, the signal processing unit 208 performs operations of performing various correction or compression to output image data, if necessary. The imaging device 201 may include an AD conversion unit that generates a digital signal processed in the signal processing unit 208. The AD conversion unit may be formed in a semiconductor layer (a semiconductor substrate) in which the photoelectric converter of the imaging device 201 is formed or may be formed on a different semiconductor substrate from the semiconductor layer in which the photoelectric converter of the imaging device 201 is formed. Further, the signal processing unit 208 may be formed on the same semiconductor substrate as the imaging device 201.

Furthermore, the imaging system 200 includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

Furthermore, the imaging system 200 includes a general control/operation unit 218 that performs various calculation and controls the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As described above, according to the present embodiment, the imaging system to which the photoelectric conversion device according to any of the first to fifth embodiments is applied can be realized.

Seventh Embodiment

Figure 11A:
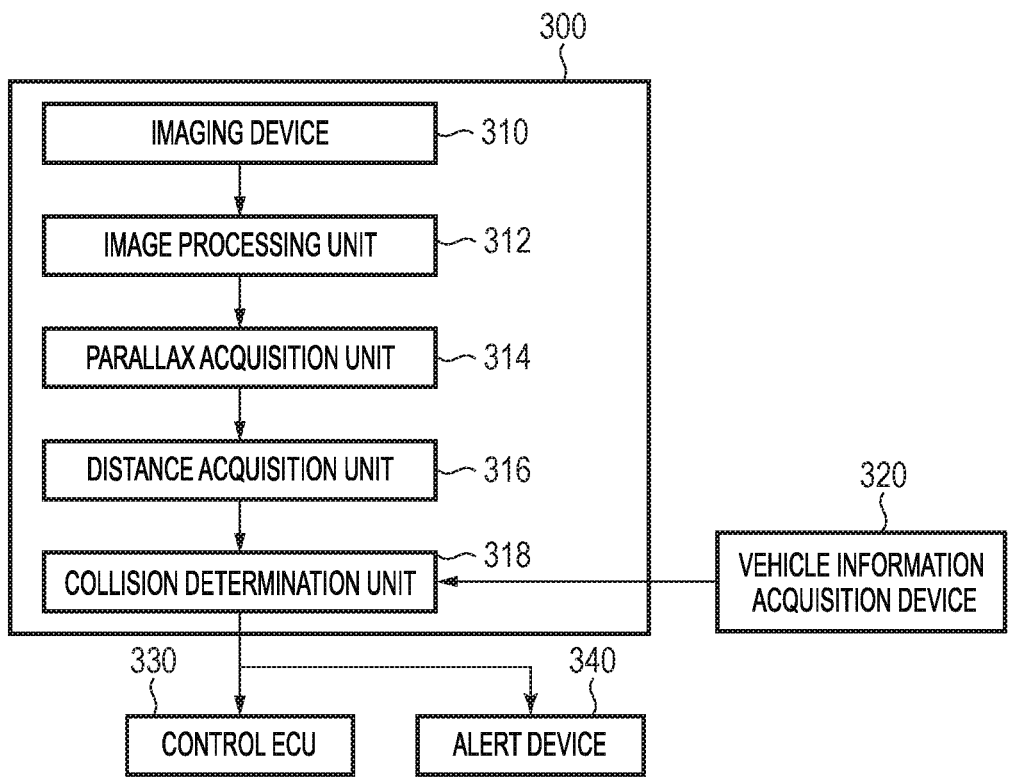
FIG. 11A is a diagram illustrating a configuration example of an imaging system according to a seventh embodiment of the present invention.
Figure 11B:
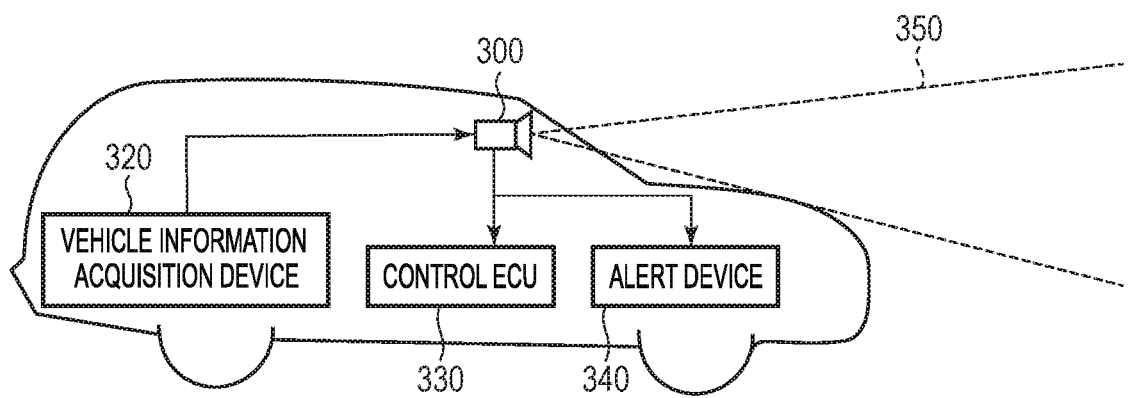
FIG. 11B is a diagram illustrating a configuration example of a movable object according to the seventh embodiment of the present invention.

An imaging system and a movable object according to a seventh embodiment of the present invention will be described with reference to FIG. 11A and FIG. 11B. FIG. 11A is a diagram illustrating a configuration of the imaging system according to the present embodiment. FIG. 11B is a diagram illustrating a configuration of the movable object according to the present embodiment.

FIG. 11A illustrates an example of an imaging system related to an on-vehicle camera. An imaging system 300 includes an imaging device 310. The imaging device 310 is the photoelectric conversion device 100 described in any of the above first to fifth embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 11B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present invention.

Further, although the example in which two output lines are arranged on each column of the pixel array and these output lines are connected to different AD conversion circuit units has been described in the above embodiments, one output line may be arranged on each column of the pixel array, and all the output lines may be connected to a single AD conversion circuit unit.

Further, although the Bayer arrangement has been illustrated as the color filter arrangement in the above embodiments, the color filter arrangement is not limited to the Bayer arrangement. Further, the color filter arrangement may be not only the RGB arrangement but also CMYW arrangement including a C pixel having cyan CF, an M pixel having a magenta CF, a Y pixel having a yellow CF, and a W pixel. Further, the plurality of pixels 12 forming the pixel region 10 may include a pixel (white pixel) used for directly detecting incident light without color separation or a pixel used for infrared detection in addition to the above color pixels.

Further, the imaging systems illustrated in the above sixth and seventh embodiments are provided as examples of an imaging system to which the photoelectric conversion device of the present invention may be applied, and an imaging system to which the photoelectric conversion device of the present invention can be applied is not limited to the configuration illustrated in FIG. 10 and FIG. 11A.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-187903, filed Oct. 11, 2019 which is hereby incorporated by reference herein in its entirety.

What is claimed is:
1. A photoelectric conversion device comprising:
a plurality of pixels arranged to form a plurality of columns;
a plurality of comparator circuits provided in association with the plurality of columns; and
a control circuit that controls the plurality of comparator circuits,
wherein the plurality of comparator circuits includes
a first comparator circuit connected to a first pixel having sensitivity to a first color,
a second comparator circuit arranged on a column adjacent to a column of the first comparator circuit and connected to a second pixel having sensitivity to a second color that is different from the first color, and a third comparator circuit arranged on a column adjacent to a column of the second comparator circuit and connected to a third pixel having sensitivity to the first color, wherein each of the plurality of comparator circuits compares a pixel signal output from a pixel on a corresponding column with a reference signal whose level changes as time elapses and outputs a comparison signal indicating different levels in accordance with whether a difference between the pixel signal and the reference signal is smaller than or larger than the threshold value, and wherein the control circuit controls the threshold value of each of the plurality of comparator circuits so as to change the threshold value stepwise in order of the first comparator circuit, the third comparator circuit, and the second comparator circuit.

2. The photoelectric conversion device according to claim 1, wherein each of the plurality of comparator circuits includes a first reset switch that connects a first input node that receives the pixel signal and a first output node to each other and a second reset switch that connects a second input node that receives the reference signal and a second output node to each other, and wherein the control circuit controls the threshold value of the plurality of comparator circuits in accordance with a timing to switch the first reset switch and the second reset switch from an on-state to an off-state.

3. The photoelectric conversion device according to claim 1, wherein each of the plurality of comparator circuits includes a first reset switch that connects a first input node that receives the pixel signal and a first output node to each other and a second reset switch that connects a second input node that receives the reference signal and a second output node to each other, and wherein the control circuit controls the threshold value of the plurality of comparator circuits by delaying a timing to switch the first reset switch and the second reset switch from an on-state to an off-state in order of the first comparator circuit, the third comparator circuit, and the second comparator circuit.

4. The photoelectric conversion device according to claim 1, wherein each of the plurality of comparator circuits includes a first reset switch that connects a first input node that receives the pixel signal and a first output node to each other and a second reset switch that connects a second input node that receives the reference signal and a second output node to each other, and wherein the threshold value is a potential difference between the first input node and the second input node occurring when the first reset switch and the second reset switch are switched from an on-state to an off-state.

5. The photoelectric conversion device according to claim 1, wherein the plurality of comparator circuits further includes a fourth comparator circuit arranged on a column adjacent to a column of the third comparator circuit and connected to a fourth pixel having sensitivity to the second color, and wherein the control circuit is configured to control the threshold value of each of the plurality of comparator circuits so as to change the threshold value stepwise in order of the first comparator circuit, the third comparator circuit, the second comparator circuit, and the fourth comparator circuit.

6. The photoelectric conversion device according to claim 1 further comprising a plurality of memories provided in association with the plurality of columns, wherein each of the plurality of memories holds, as digital data of the pixel signal, a count value in accordance with a timing when a level of the comparison signal output from a comparator circuit on a corresponding column changes.

7. The photoelectric conversion device according to claim 1, wherein spectral sensitivity of the first pixel and the third pixel is higher than spectral sensitivity of the second pixel.

8. The photoelectric conversion device according to claim 1, wherein a difference between a threshold value of the second comparator circuit and a threshold value of the third comparator circuit is larger than a difference between a threshold value of the first comparator circuit and a threshold value of the third comparator circuit.

9. The photoelectric conversion device according to claim 1, wherein an interconnection used for supplying a control signal from the control circuit to the first comparator circuit and the third comparator circuit and an interconnection used for supplying a control signal from the control circuit to the second comparator circuit are different from each other.

10. The photoelectric conversion device according to claim 1, wherein the reference signal is a common signal input to the plurality of comparator circuits.

11. The photoelectric conversion device according to claim 1, wherein the first pixel and the second pixel are arranged on adjacent columns on adjacent rows, respectively.

12. The photoelectric conversion device according to claim 11, wherein the first pixel is an R pixel, and the second pixel is a B pixel.

13. The photoelectric conversion device according to claim 1, wherein the first pixel and the second pixel are arranged on the same column on adjacent rows, respectively.

14. The photoelectric conversion device according to claim 1, wherein the first pixel and the second pixel are arranged on adjacent columns on the same row, respectively.

15. The photoelectric conversion device according to claim 13, wherein the first pixel is a G pixel, and the second pixel is an R pixel.

16. The photoelectric conversion device according to claim 13, wherein the first pixel is a G pixel, and the second pixel is a B pixel.

17. The photoelectric conversion device according to claim 1 further comprising: a first reset signal line used for supplying a reset signal from the control circuit to the first comparator circuit; a second reset signal line used for supplying a reset signal from the control circuit to the second comparator circuit; and a third reset signal line used for supplying a reset signal from the control circuit to the third comparator circuit.

18. An imaging system comprising:
the photoelectric conversion device according to claim 1; and
a signal processing unit that processes a signal output from the photoelectric conversion device.

19. A movable object comprising:
the photoelectric conversion device according to claim 1;

a distance information acquisition unit that acquires distance information on a distance to an object, from a parallax image based on signals from the photoelectric conversion device; and a control unit that controls the movable object based on the distance information.

* * * * *